(12) United States Patent
Seong et al.

(10) Patent No.: US 12,389,771 B2
(45) Date of Patent: Aug. 12, 2025

(54) ORGANIC LIGHT-EMITTING DISPLAY PANEL AND ORGANIC LIGHT-EMITTING DISPLAY DEVICE INCLUDING THE SAME

(71) Applicant: LG Display Co., Ltd., Seoul (KR)

(72) Inventors: Sejong Seong, Paju-si (KR); Soyoung Lee, Paju-si (KR); JongSung Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 497 days.

(21) Appl. No.: 17/975,351

(22) Filed: Oct. 27, 2022

(65) Prior Publication Data

US 2023/0157104 A1 May 18, 2023

(30) Foreign Application Priority Data

Nov. 16, 2021 (KR) .......................... 10-2021-0157555

(51) Int. Cl.
*H10K 59/131* (2023.01)
*H10K 59/121* (2023.01)
*H10K 59/80* (2023.01)

(52) U.S. Cl.
CPC ................................. *H10K 59/131* (2023.02)

(58) Field of Classification Search
CPC .. H10K 59/131; H10K 59/121; H10K 59/124; H10K 59/80; G09G 3/006
See application file for complete search history.

(56) References Cited

U.S. PATENT DOCUMENTS

2005/0269962 A1* 12/2005 Matsunaga ............ H10K 59/12
315/169.3
2017/0005153 A1* 1/2017 Heo ...................... H10K 59/123

* cited by examiner

*Primary Examiner* — Sardis F Azongha
(74) *Attorney, Agent, or Firm* — Birch, Stewart, Kolasch & Birch, LLP

(57) ABSTRACT

Embodiments of the present disclosure relate to an organic light-emitting display panel and an organic light-emitting display device including the same. The organic light-emitting display device can include at least one emission area including a first sub-emission area disposed in a first sub-row and a second sub-emission area disposed in a second sub-row adjacent to the first sub-row, wherein a plurality of first electrodes are disposed in each of the first and second sub-emission areas, and a connection pattern electrically connected to the first electrode and including a first connection pattern and a second connection pattern electrically connected to and formed integrally with a circuit area. A repair pattern is disposed between the first sub-emission area of one emission area and the second sub-emission area of the emission area disposed in another adjacent row.

23 Claims, 24 Drawing Sheets

FIG.5
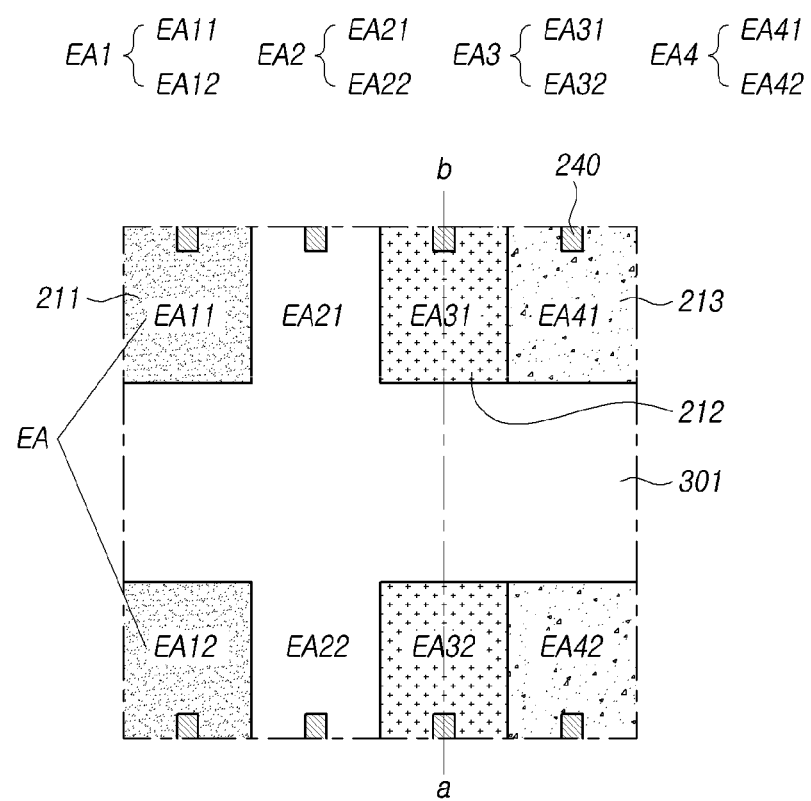
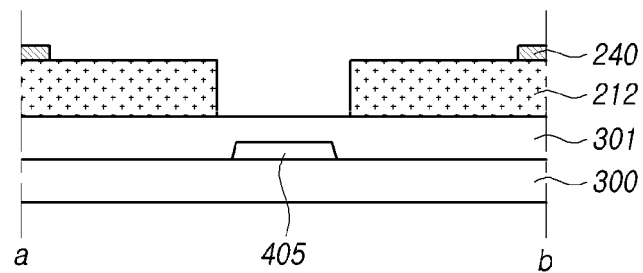

FIG.6
EA1 { EA11, EA12 }   EA2 { EA21, EA22 }   EA3 { EA31, EA32 }   EA4 { EA41, EA42 }
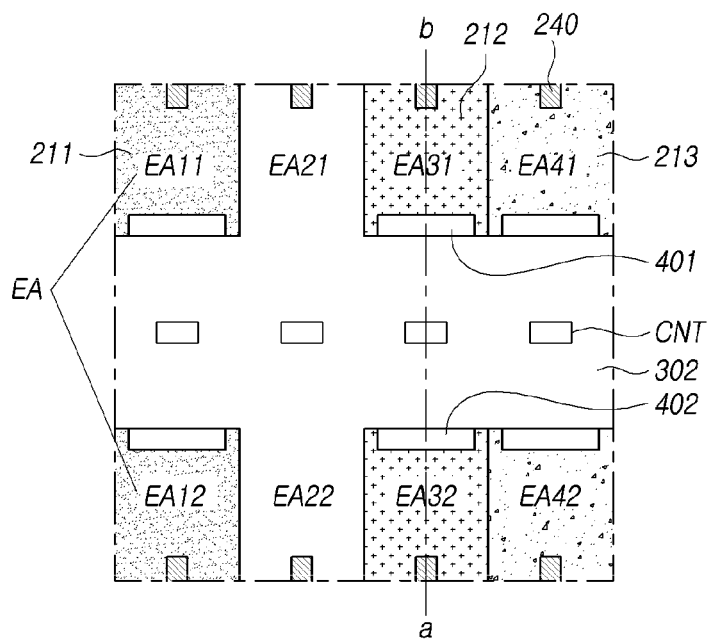
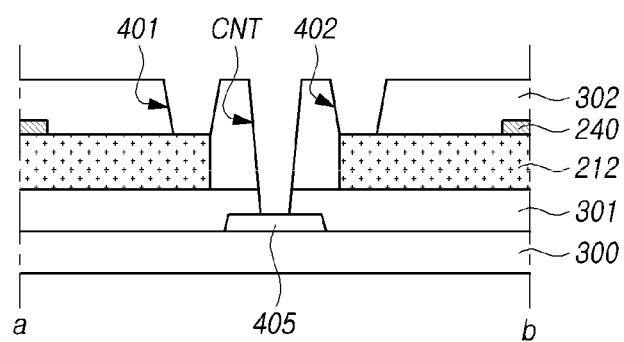

FIG.7
$EA1 \begin{cases} EA11 \\ EA12 \end{cases}$  $EA2 \begin{cases} EA21 \\ EA22 \end{cases}$  $EA3 \begin{cases} EA31 \\ EA32 \end{cases}$  $EA4 \begin{cases} EA41 \\ EA42 \end{cases}$
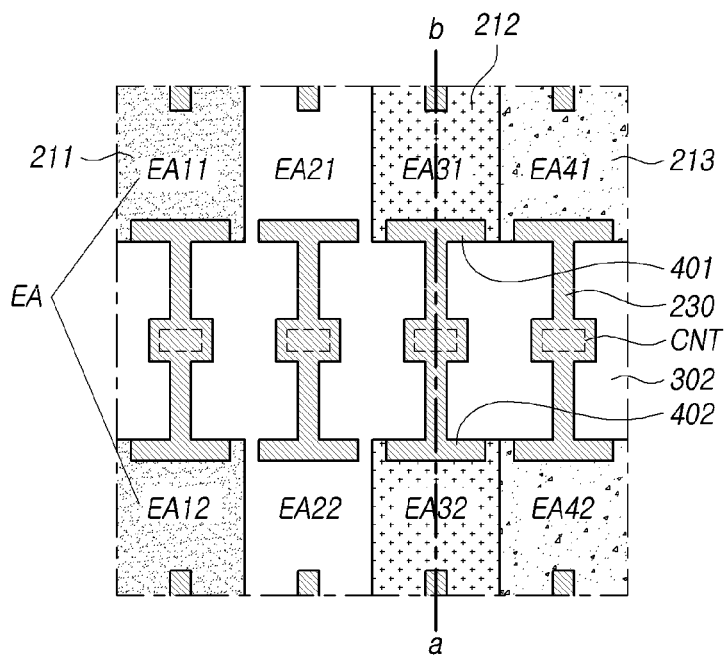
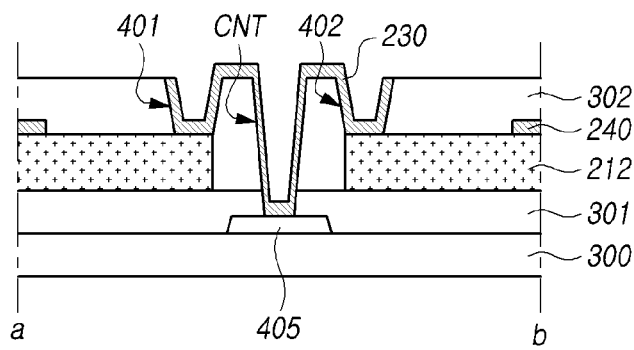

FIG.8
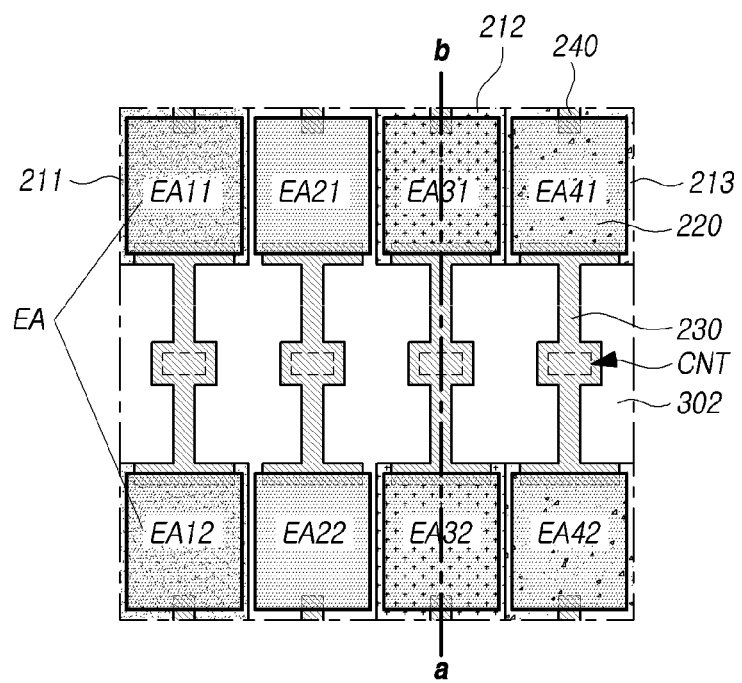
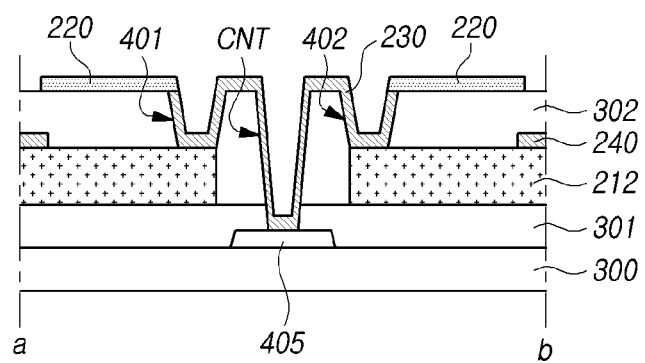

FIG.9
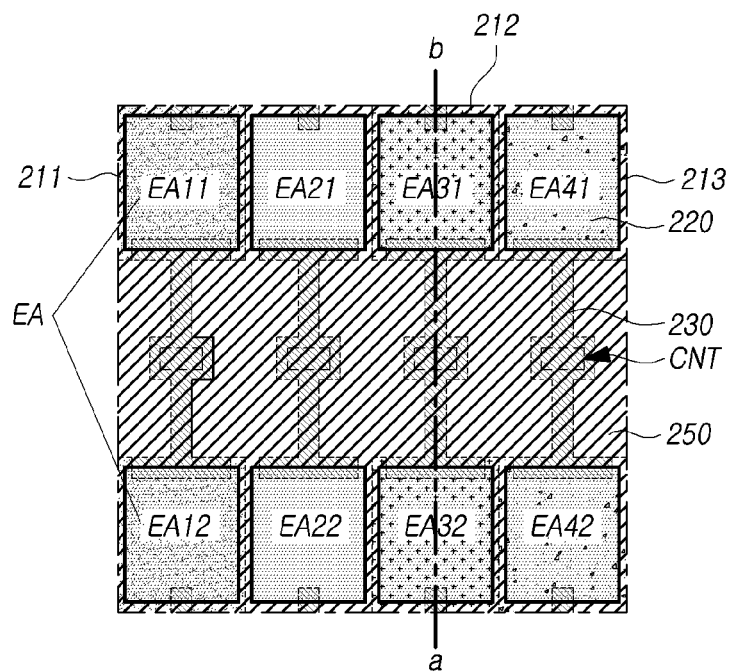
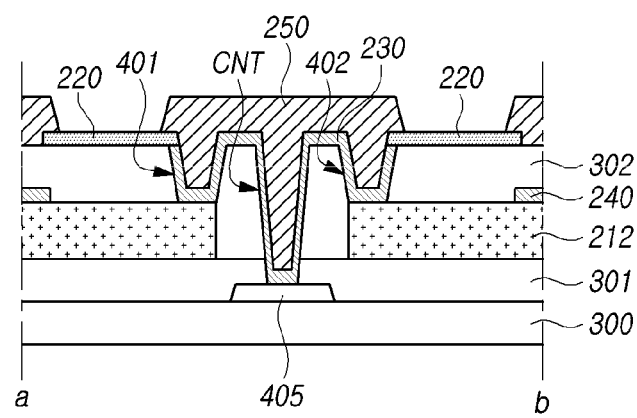

FIG. 12
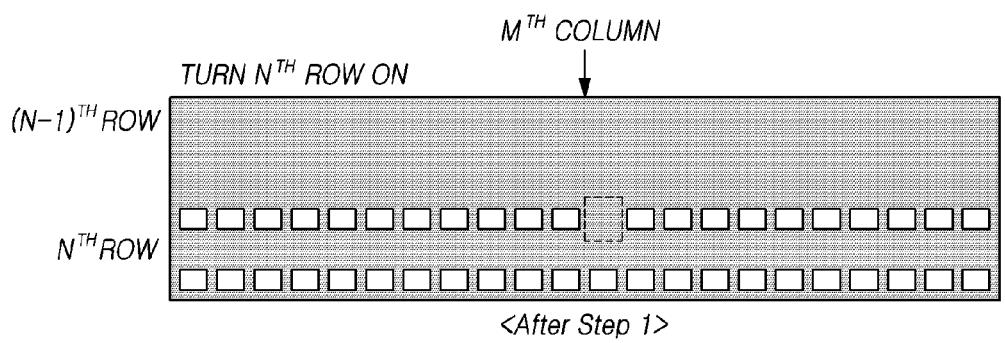
<After Step 1>
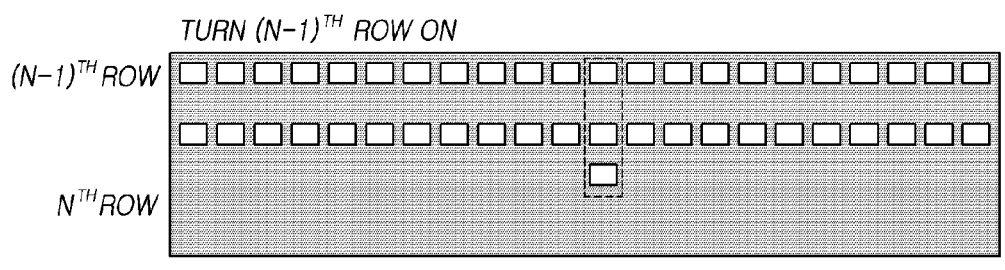
<After Step 2>

EA1 : EA11, EA12, EA13, EA14
EA2 : EA21, EA22, EA23, EA24
EA3 : EA31, EA32, EA33, EA34
EA4 : EA41, EA42, EA43, EA44

EA1 : EA11, EA12, EA13, EA14
EA2 : EA21, EA22, EA23, EA24
EA3 : EA31, EA32, EA33, EA34
EA4 : EA41, EA42, EA43, EA44

EA1 : EA11, EA12, EA13, EA14
EA2 : EA21, EA22, EA23, EA24
EA3 : EA31, EA32, EA33, EA34
EA4 : EA41, EA42, EA43, EA44

FIG.24
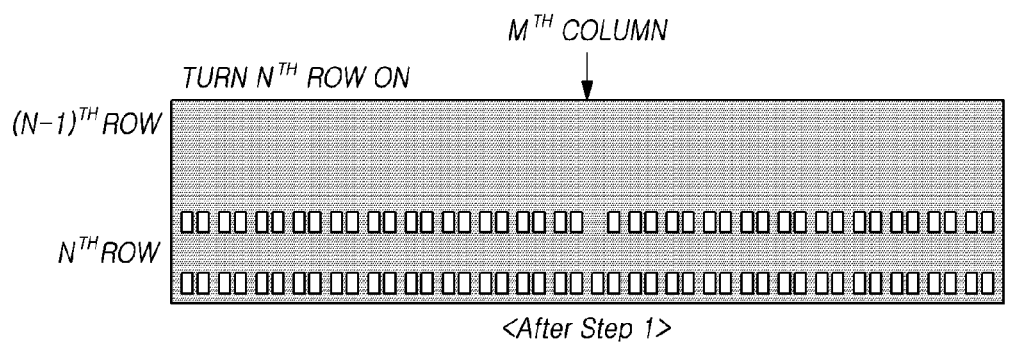
<After Step 1>
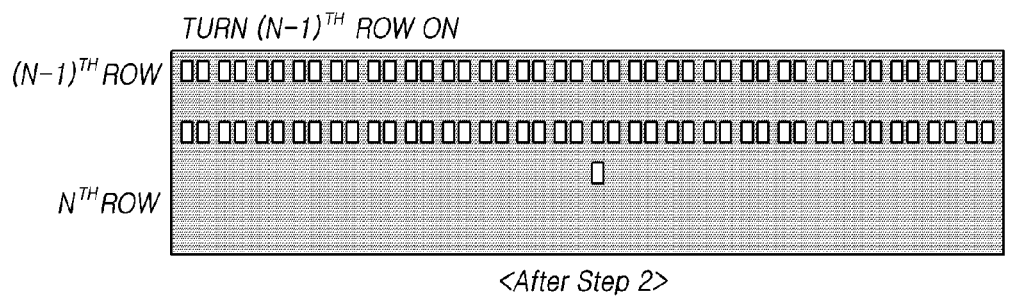
<After Step 2>

ORGANIC LIGHT-EMITTING DISPLAY PANEL AND ORGANIC LIGHT-EMITTING DISPLAY DEVICE INCLUDING THE SAME

CROSS REFERENCE TO RELATED APPLICATION

This application claims priority to Korean Patent Application No. 10-2021-0157555, filed in the Republic of Korea on Nov. 16, 2021, the entire contents of which are hereby expressly incorporated by reference into the present application.

BACKGROUND OF THE INVENTION

1. Field of the Invention

Embodiments of the present disclosure relate to an organic light-emitting display panel and an organic light-emitting display device including the same.

2. Description of the Related Art

An organic light-emitting display device includes a thin film transistor (TFT), a plurality of conductive layers, and an organic light-emitting element.

In a process of manufacturing an organic light-emitting display device, a bright spot defect may be generated in some emission areas due to a foreign material or the like.

In some organic light-emitting display devices, in order to prevent a bright spot defect, a repair process for disconnecting an emission area in which a bright spot can be generated from a circuit area for driving the emission area is performed, but the visibility of the organic light-emitting display device after the repair process may be lowered.

SUMMARY OF THE INVENTION

An aspect of the present disclosure is to provide an organic light-emitting display panel in which, even when a foreign material is present in an active area, a bright spot defect is not generated due to a connection pattern and a repair pattern, and an organic light-emitting display device including the same.

Another aspect of the present disclosure is to provide an organic light-emitting display panel which has a structure capable of preventing a decrease in visibility by reducing an area for emitting light in an emission area connected to a circuit area of an emission area disposed in an adjacent row, and an organic light-emitting display device including the same.

Still another aspect of the present disclosure is to provide an organic light-emitting display panel having an improved light extraction effect by reducing an amount of light trapped in an organic light-emitting display panel through a connection pattern disposed in a non-emission area and increasing an amount of light extracted out of a substrate, and an organic light-emitting display device including the same.

In an aspect, embodiments of the present disclosure can provide an organic light-emitting display device including at least two emission areas, wherein at least one emission area includes a first sub-emission area disposed in a first sub-row and a second sub-emission area disposed in a second sub-row adjacent to the first sub-row, and a plurality of first electrodes are disposed in each of the first and second sub-emission areas, a non-emission area configured to surround the emission areas, one circuit area disposed between the first sub-row and the second sub-row and configured to drive the first and second sub-emission areas, and a connection pattern electrically connected to the first electrode and including a first connection pattern and a second connection pattern electrically connected to and formed integrally with the circuit area, wherein the first electrode disposed in the first sub-emission area is connected to the first connection pattern, the first electrode disposed in the second sub-emission area is connected to the second connection pattern, a repair pattern is disposed between the first sub-emission area of one emission area and the second sub-emission area of the emission area disposed in another adjacent row, and the repair pattern is spaced apart from the connection pattern.

In another aspect, embodiments of the present disclosure can provide an organic light-emitting display panel including at least two emission areas including a first electrode, an organic light-emitting layer, and a second electrode, wherein at least one emission area includes a first sub-emission area disposed in a first sub-row and a second sub-emission area disposed in a second sub-row adjacent to the first sub-row, and a plurality of first electrodes identical to the first electrode are disposed in each of the first and second sub-emission areas, a non-emission area configured to surround the emission areas, one circuit area disposed between the first sub-row and the second sub-row and configured to drive the first and second sub-emission areas, and a connection pattern electrically connected to the first electrode and including a first connection pattern and a second connection pattern electrically connected to and formed integrally with the circuit area, wherein the first electrode disposed in the first sub-emission area is connected to the first connection pattern, the first electrode disposed in the second sub-emission area is connected to the second connection pattern, and a repair pattern is disposed between the first sub-emission area of one emission area and the second sub-emission area of the emission area disposed in another adjacent row.

According to embodiments of the present disclosure, an organic light-emitting display panel in which, even when a foreign material is present in an active area, a bright spot defect is not generated due to a connection pattern and a repair pattern, and an organic light-emitting display device including the same can be provided.

According to embodiments of the present disclosure, there can be provided an organic light-emitting display panel which has a structure capable of preventing a decrease in visibility by reducing an area for emitting light in an emission area connected to a circuit area of an emission area disposed in an adjacent row, and an organic light-emitting display device including the same.

According to embodiments of the present disclosure, there can be provided an organic light-emitting display panel having an improved light extraction effect by reducing an amount of light trapped in an organic light-emitting display panel through a connection pattern disposed in a non-emission area and increasing an amount of light extracted out of a substrate, and an organic light-emitting display device including the same.

BRIEF DESCRIPTION OF THE DRAWINGS

The above and other aspects, features and advantages of the present disclosure will be more apparent from the following detailed description taken in conjunction with the accompanying drawings, in which:

FIGS. 5 to 9 show schematic views illustrating a manufacturing process of forming the display panel shown in FIG. 2;

FIG. 12 shows views illustrating emission states when a display panel is driven after the display panel having structures of FIGS. 10 and 11 is repaired;

FIG. 24 shows views illustrating emission states when a display panel having the structure of FIGS. 22 and 23 is driven before and after the display panel is repaired.

DETAILED DESCRIPTION OF THE EMBODIMENTS

Figure 1:
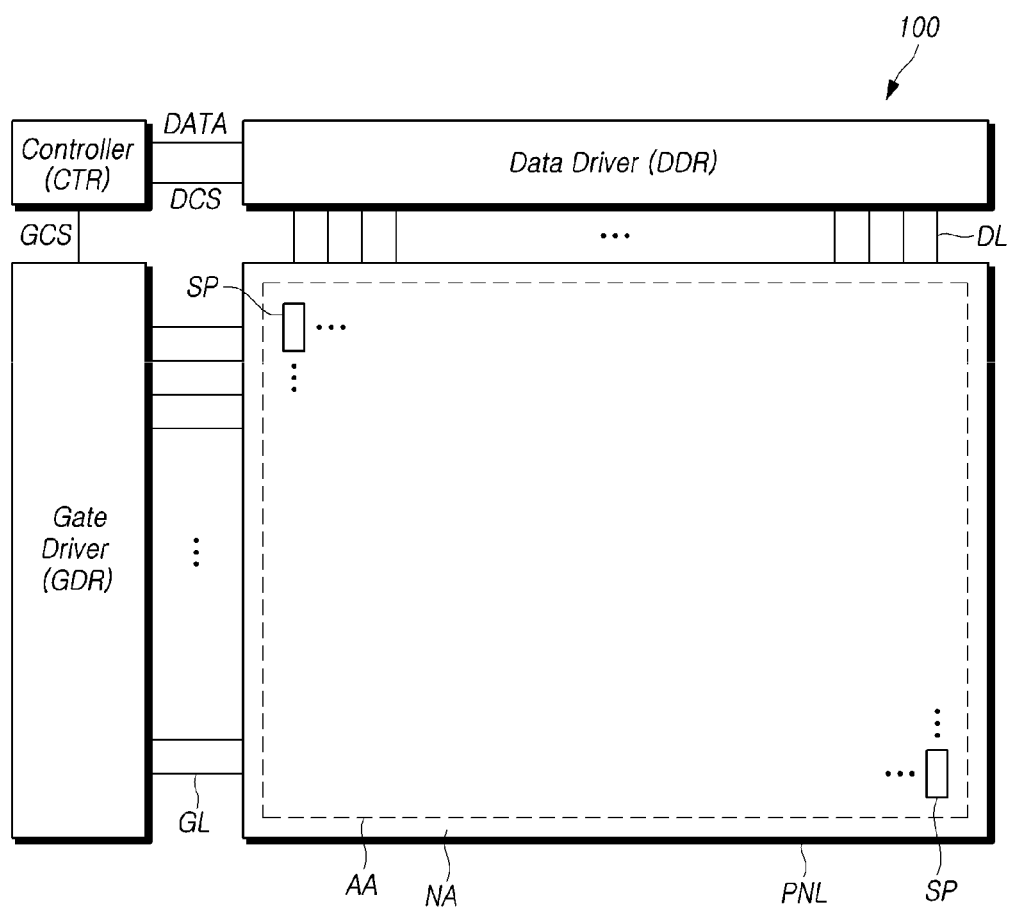
FIG. 1 is a schematic system configuration diagram of an organic light-emitting display device according to embodiments of the present disclosure.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description can make the subject matter in some embodiments of the present invention rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" can be used herein to describe elements of the present invention. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element can be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms can be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that can be caused by various factors (e.g., process factors, internal or external impact, noise, etc.) even when a relevant description is not specified. Further, the term "may" fully encompasses all the meanings of the term "can".

Hereinafter, various embodiments of the present disclosure will be described in detail with reference to the accompanying drawings. All the components of each organic light-emitting display device according to all embodiments of the present disclosure are operatively coupled and configured.

FIG. 1 is a schematic system configuration diagram of an organic light-emitting display device according to embodiments of the present disclosure.

Referring to FIG. 1, an organic light-emitting display device 100 according to embodiments of the present disclosure can include an organic light-emitting display device 100, a lighting device, a light-emitting device, and the like. Hereinafter, for convenience of description, the organic light-emitting display device 100 will be mainly described. However, the same will be applied to the organic light-emitting display device 100 as well as various other organic light-emitting display devices 100 such as a lighting device and a light-emitting device as long as the devices include a transistor.

The organic light-emitting display device 100 according to embodiments of the present disclosure can include a display panel PNL for displaying an image or outputting light and a driving circuit for driving the display panel PNL.

In addition, the organic light-emitting display device 100 according to embodiments of the present disclosure can be a bottom emission type organic light-emitting display device in which light is emitted toward a substrate on which a light-emitting element is disposed, but the present disclosure is not limited thereto. In some cases, the organic light-emitting display device 100 of the present disclosure can be a top emission type in which light is emitted to a surface opposite to a substrate on which a light-emitting element is disposed or can be a dual emission type in which light emitted from a light-emitting element is emitted toward a substrate and a surface opposite to the substrate.

In the display panel PNL, a plurality of data lines DL and a plurality of gate lines GL can be disposed. A plurality of subpixels SP defined by the plurality of data lines DL and the plurality of gate lines GL can be arranged in a matrix type in the display panel PNL.

In the display panel PNL, the plurality of data lines DL and the plurality of gate lines GL can be disposed to intersect each other. For example, the plurality of gate lines GL can be arranged in rows or columns, and the plurality of data lines DL can be arranged in columns or rows. Hereinafter, for convenience of description, it is assumed that the plurality of gate lines GL are arranged in rows and the plurality of data lines DL are arranged in columns.

In addition to the plurality of data lines DL and the plurality of gate lines GL, other types of signal lines can be disposed in the display panel PNL according to a subpixel structure or the like. A driving power line, a reference power line, or a common power line can be further disposed in the display panel PNL.

Types of signal lines disposed in the display panel PNL can vary depending on the subpixel structure or the like. In the present specification, the signal line can be a concept including an electrode to which a signal is applied.

The display panel PNL can include an active area A/A in which an image (video) is displayed and a non-active area N/A which is an area around the active area N/A and in which an image is not displayed. Here, the non-active area N/A is also referred to as a bezel area.

The plurality of subpixels SP for displaying an image are disposed in the active area A/A.

A pad area to which a data driver DDR is electrically connected can be disposed in the non-active area N/A. A plurality of data link lines for connecting the pad area and the plurality of data lines DL can be disposed in the non-active area N/A. Here, the plurality of data link lines can be portions of the plurality of data lines DL which extend to the non-active area N/A or can be separate patterns electrically connected to the plurality of data lines DL.

In addition, gate driving-related lines, which transmit voltages (signals) necessary for gate driving to a gate driver GDR through a pad part to which the data driver DDR is electrically connected, can be disposed in the non-active area N/A. For example, the gate driving-related lines can include clock lines for transmitting clock signals, gate power lines for transmitting gate voltages VGH and VGL, and gate driving control signal lines for transmitting various control signals necessary for generating scan signals. The gate driving-related lines are disposed in the non-active area N/A unlike the gate lines GL disposed in the active area A/A.

A driving circuit can include the data driver DDR which drives the plurality of data lines DL, the gate driver GDR which drives the plurality of gate lines GL, a controller CTR which controls the data driver DDR and the gate driver GDR, and the like.

The data driver DDR can drive the plurality of data lines DL by outputting data voltages to the plurality of data lines DL.

The gate driver GDR can drive the plurality of gate lines GL by outputting scan signals to the plurality of gate lines GL.

The controller CTR can control driving operations of the data driver DDR and the gate driver GDR by supplying various control signals DCS and GCS necessary for driving operations of the data driver DDR and the gate driver GDR. In addition, the controller CTR can supply image data DATA to the data driver DDR.

The controller CTR starts scanning according to a timing implemented in each frame. The controller CTR converts image data input from an external device to be suitable for a data signal format used by the data driver DDR, outputs the converted image data, and controls driving of data at an appropriate time according to scanning.

In order to control the data driver DDR and the gate driver GDR, the controller CTR can generate various control signals by receiving timing signals such as a vertical synchronization signal Vsync, a horizontal synchronization signal Hsync, an input data enable (DE) signal, and a clock signal CLK from an external device (for example, a host system). The controller CTR outputs the generated various control signals to the data driver DDR and the gate driver GDR.

For example, in order to control the gate driver GDR, the controller CTR outputs various gate control signals (GCSs) including gate start pulse (GSP), gate shift clock (GSC), and gate output enable (GOE) signals.

In addition, in order to control the data driver DDR, the controller CTR outputs various data control signals (DCSs) including source start pulse (SSP), source sampling clock (SSC), and source output enable (SOE) signals.

The controller CTR can be a timing controller used in a typical display technology. Alternatively, the controller CTR can be a control device including a timing controller to further perform other control functions.

The controller CTR can be implemented as a separate component from the data driver DDR. Alternatively, the controller CTR can be integrated with the data driver DDR to be implemented as an integrated circuit.

The data driver DDR receives the image data DATA from the controller CTR and supplies data voltages to the plurality of data lines DL to drive the plurality of data lines DL. Here, the data driver DDR is also referred to as a source driver.

The data driver DDR can transmit and receive various signals to and from the controller CTR through various interfaces.

The gate driver GDR sequentially drives the plurality of gate lines GL by sequentially supplying scan signals to the plurality of gate lines GL. Here, the gate driver GDR is also referred to as a scan driver.

The gate driver GDR sequentially supplies scan signals having an on-voltage or an off-voltage to the plurality of gate lines GL under the control of the controller CTR.

When a specific gate line is opened by the gate driver GDR, the data driver DDR converts the image data DATA received from the controller CTR into an analog data voltage and supplies the analog data voltage to the plurality of data lines DL.

The data driver DDR can be positioned at one side (for example, an upper or lower side) of the display panel PNL. However, the present disclosure is not limited thereto. For example, the data driver DDR can be positioned at each of two sides (for example, the upper and lower sides) of the display panel PNL according to a driving method or a display panel design method.

The gate driver GDR can be positioned at one side (for example, a left or right side) of the display panel PNL. However, the present disclosure is not limited thereto. For example, the gate driver GDR can be positioned at each of two sides (for example, the left and right sides) of the display panel PNL according to a driving method or a display panel design method.

The data driver DDR can be implemented to include one or more source driver integrated circuits (SDICs).

Each SDIC can include a shift register, a latch circuit, a digital-to-analog converter (DAC), an output buffer, and the like. In some cases, the data driver DDR can further include one or more analog-to-digital converters (ADCs).

Each SDIC can be connected to a bonding pad of the display panel PNL in a tape automated bonding (TAB) type or a chip-on-glass (COG) type. Alternatively, each SDIC can be disposed directly on the display panel PNL. In some cases, the SDICs can be integrated and disposed on the display panel PNL. In addition, each SDIC can be implemented as a chip-on-film (COF) type. In this case, each SDIC can be mounted on a circuit film. Each SDIC mounted on the circuit film can be electrically connected to the data lines DL of the display panel PNL through the circuit film.

The gate driver GDR can include a plurality of gate driving circuits GDC. Here, the plurality of gate driving circuits GDC can each correspond to one of the plurality of gate lines GL.

Each gate driving circuit GDC can include a shift register, a level shifter, and the like.

Each gate driving circuit GDC can be connected to a bonding pad of the display panel PNL in a TAB type or a COG type. In addition, each gate driving circuit GDC can be implemented as a COF type. In this case, each gate driving circuit GDC can be mounted on a circuit film. Each gate driving circuit GDC mounted on the circuit film can be electrically connected to the gate lines GL of the display panel PNL through the circuit film. In addition, each gate driving circuit GDC can be implemented as a gate-in-panel (GIP) type and embedded in the display panel PNL. Accordingly, each gate driving circuit GDC can be formed directly on the display panel PNL.

Figure 2:
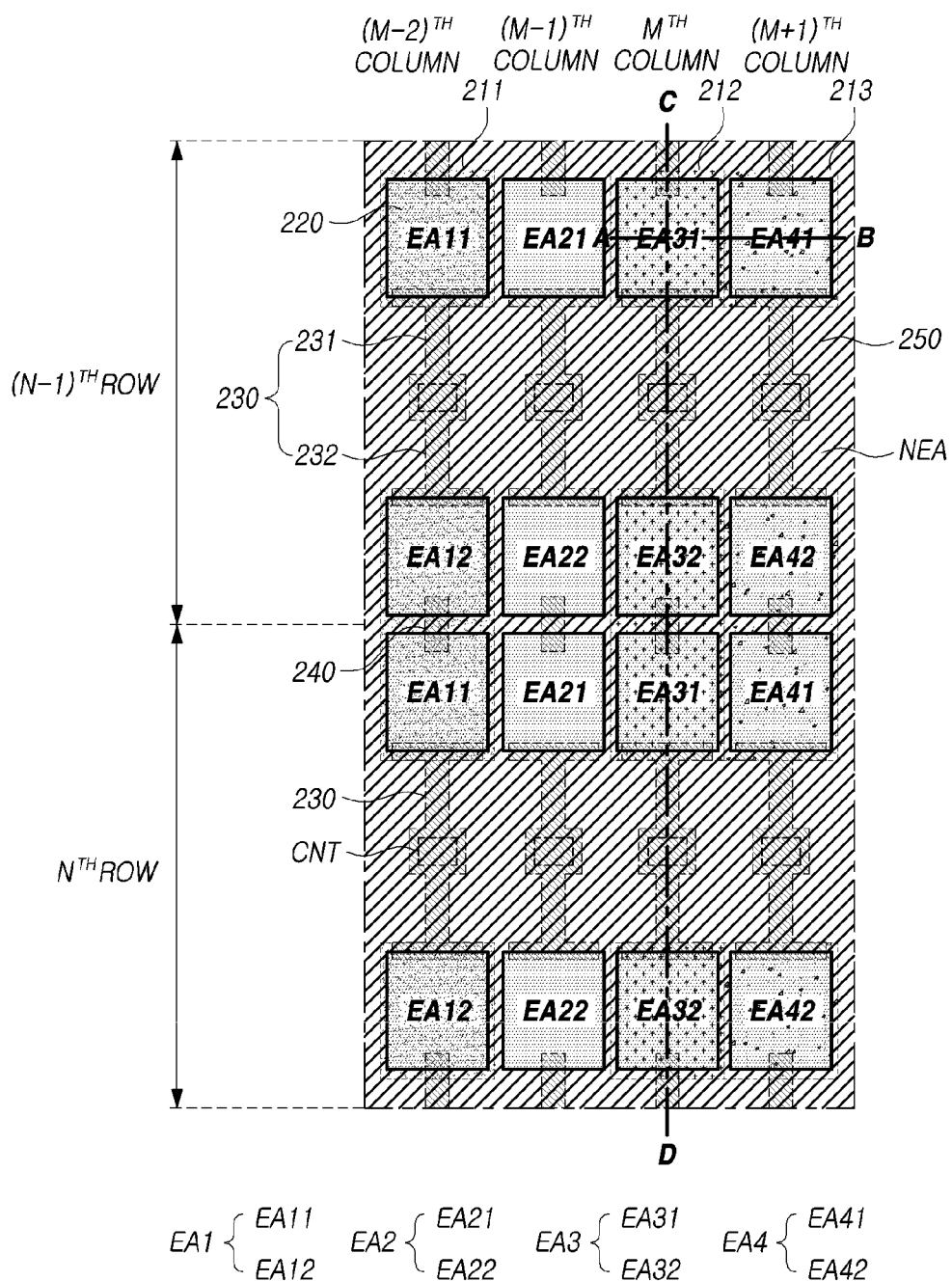
FIG. 2 is a schematic plan view illustrating a structure of a partial area of an active area in a display panel according to embodiments of the present disclosure.

FIG. 2 is a schematic plan view illustrating a structure of a partial area of an active area in a display panel according to embodiments of the present disclosure.

Referring to FIG. 2, an active area A/A of the display panel according to embodiments of the present disclosure can include a plurality of emission areas EA1, EA2, EA3, and EA4 and a non-emission area NEA surrounding the emission areas EA1, EA2, EA3, and EA4.

Further, circuit areas for driving the plurality of emission areas EA1, EA2, EA3, and EA4 can be disposed in the non-emission area.

The plurality of emission areas EA1, EA2, EA3, and EA4 can include a first emission area EA1, a second emission area EA2, a third emission area EA3, and a fourth emission area EA4.

Here, the first emission area EA1 can be an area for emitting red (R) light, the second emission area EA2 can be an area for emitting white (W) light, the third emission area EA3 can be an area for emitting blue (B) light, and the fourth emission area EA4 can be an area for emitting green (G) light.

At least one of the first to fourth emission areas EA1, EA2, EA3, and EA4 can include a plurality of sub-emission areas. The sub-emission areas included in the emission area can be disposed apart from each other.

For example, as shown in FIG. 2, the first emission area EA1 can include a first sub-emission area EA11 of the first emission area EA1 and a second sub-emission area EA12 of the first emission area EA1. An R color filter 211 can be disposed in each of the first and second sub-emission areas EA11 and EA12 of the first emission area EA1, but embodiments of the present disclosure are not limited thereto.

The first sub-emission area EA11 of the first emission area EA1 and the second sub-emission area EA12 of the first emission area EA1 can share one circuit area. One circuit area can include at least two transistors and at least one storage capacitor. In the first emission area EA1, the first sub-emission area EA11 and the second sub-emission area EA12 of the first emission area EA1 can be driven through one circuit area.

The second emission area EA2 can include a first sub-emission area EA21 of the second emission area EA2 and a second sub-emission area EA22 of the second emission area EA2. A color filter may not be disposed in each of the first and second sub-emission areas EA21 and EA22 of the second emission area EA2, but embodiments of the present disclosure are not limited thereto.

The first sub-emission area EA21 of the second emission area EA2 and the second sub-emission area EA22 of the second emission area EA2 can share one circuit area. In the second emission area EA2, the first sub-emission area EA21 and the second sub-emission area EA22 of the second emission area EA2 can be driven through one circuit area.

The third emission area EA3 can include a first sub-emission area EA31 of the third emission area EA3 and a second sub-emission area EA32 of the third emission area EA3. A B color filter 212 can be disposed in each of the first and second sub-emission areas EA31 and EA32 of the third emission area EA3, but embodiments of the present disclosure are not limited thereto.

In the third emission area EA3, the first sub-emission area EA31 and the second sub-emission area EA32 of the third emission area EA3 can be driven through one circuit area.

The fourth emission area EA4 can include a first sub-emission area EA41 of the fourth emission area EA4 and a second sub-emission area EA42 of the fourth emission area EA4. A G color filter 213 can be disposed in each of the first and second sub-emission areas EA41 and EA42 of the fourth emission area EA4, but embodiments of the present disclosure are not limited thereto.

In the fourth emission area EA4, the first sub-emission area EA41 and the second sub-emission area EA42 of the fourth emission area EA4 can be driven through one circuit area.

The plurality of emission areas EA1, EA2, EA3, and EA4 can be disposed in a plurality of rows and a plurality of columns in the active area A/A.

Specifically, at least one first emission area EA1, at least one second emission area EA2, at least one third emission area EA3, and at least one fourth emission area EA4 can be disposed in each row.

In one row, the first sub-emission area EA11 of the first emission area EA1 and the second sub-emission area EA12 of the first emission area EA1 can be disposed apart from each other. In addition, the circuit area of the first emission area EA1 can be disposed between the first sub-emission area EA11 of the first emission area EA1 and the second sub-emission area EA12 of the first emission area EA1.

In addition, in one row, the first sub-emission area EA21 of the second emission area EA2 adjacent to the first emission area EA1 and the second sub-emission area EA22 of the second emission area EA2 can be disposed apart from each other. The circuit area of the second emission area EA2 can be disposed between the first sub-emission area EA21 of the second emission area EA2 and the second sub-emission area EA22 of the second emission area EA2.

In one row, the first sub-emission area EA31 of the third emission area EA3 adjacent to the second emission area EA2 and the second sub-emission area EA32 of the third emission area EA3 can be disposed apart from each other. The circuit area of the third emission area EA3 can be disposed between the first sub-emission area EA31 of the third emission area EA3 and the second sub-emission area EA32 of the third emission area EA3.

In addition, in one row, the first sub-emission area EA41 of the fourth emission area EA4 adjacent to the third emission area EA3 and the second sub-emission area EA42 of the fourth emission area EA4 can be disposed apart from each other. The circuit area of the fourth emission area EA4 can be disposed between the first sub-emission area EA41 of the fourth emission area EA4 and the second sub-emission EA42 of the fourth emission area EA4.

The first sub-emission areas EA11, EA12, EA13, and EA14 of the emission areas EA1, EA2, EA3, and EA4 disposed in the same row in the active area A/A can be disposed side by side with each other, the circuit areas of the emission areas EA1, EA2, EA3, and EA4 can also be arranged side by side with each other, and the second sub-emission areas EA21, EA22, EA23, and EA24 of the emission areas EA1, EA2, EA3, and EA4 can also be disposed side by side with each other.

The sub-emission areas of each of the emission areas EA1, EA2, EA3, and EA4 disposed in the same row can be connected through a connection pattern 230.

Specifically, each of the sub-emission areas EA11, EA12, EA21, EA22, EA31, EA32, EA41, and EA42 included in the emission areas EA1, EA2, EA3, and EA4 can include an anode 220 (hereinafter, referred to as a first electrode) of an organic light-emitting element. The connection pattern 230 can be connected to at least two anodes 220.

For example, one end portion of the first electrode 220 disposed in the first sub-emission area EA11 of the first emission area EA1 can be connected to one end portion of the connection pattern 230, and one end portion of the first electrode 220 disposed in the second sub-emission area EA12 of the first emission area EA1 can be connected to the other end portion of the connection pattern 230.

The connection pattern 230 connected to the first electrodes 220 disposed in the first and second sub-emission areas EA11 and EA12 of the first emission area EA1 can be electrically connected to the circuit area of the first emission area EA1 positioned between the first sub-emission area EA11 and the second sub-emission area EA12.

For example, a first connection pattern 231 can be connected to the first sub-emission area EA11, and a second connection pattern 232 can be connected to the second sub-emission area EA12. In this case, the connection pattern 230 can be electrically connected to the transistor (for example, a driving transistor) positioned in the circuit area through a contact hole CNT formed in an insulating layer disposed below the connection pattern 230.

In addition, each of one end portions of the first electrodes 220 disposed in the first sub-emission areas EA21, EA31, and EA41 of the second to fourth emission areas EA2, EA3, and EA4 can also be connected to one end portion of one connection pattern 230, and each of one end portions of the first electrodes 220 disposed in the second sub-emission areas EA22, EA32, and EA42 of the second to fourth emission areas EA2, EA3, and EA4 can also be connected to the other end portion of one connection pattern 230.

At least one repair pattern 240 can be disposed between a first sub-emission area included in at least one emission area of the plurality of emission areas disposed in the plurality of rows of the active area A/A and a second sub-emission area of another emission area disposed in a row adjacent to the one emission area.

For example, at least one repair pattern 240 can be disposed between the second sub-emission area EA12 of the first emission area EA1 disposed in an $(N-1)^{th}$ row and the first sub-emission area EA11 of the first emission area EA1 disposed in an $N^{th}$ row.

In addition, at least one repair pattern 240 can be disposed between the second sub-emission area EA22 of the second emission area EA2 disposed in the $(N-1)^{th}$ row and the first sub-emission area EA21 of the second emission area EA2 disposed in the $N^{th}$ row.

Furthermore, at least one repair pattern 240 can be disposed between the second sub-emission area EA32 of the third emission area EA3 disposed in the $(N-1)^{th}$ row and the first sub-emission area EA31 of the third emission area EA3 disposed in the $N^{th}$ row, and at least one repair pattern 240 can be disposed between the second sub-emission area EA42 of the fourth emission area EA4 disposed in the $(N-1)^{th}$ row and the first sub-emission area EA41 of the fourth emission area EA4 disposed in the $N^{th}$ row.

When a foreign material is generated on the connection pattern 230 and a bright spot or a dark spot is generated in one emission area, the connection pattern 230 can be electrically disconnected from the circuit area through laser cutting. The first electrode 220 of the sub-emission area, which cannot receive a voltage from the circuit area due to the connection pattern 230 electrically disconnected from the circuit area, is connected to the repair pattern 240 through laser welding and electrically connected to the circuit area in another adjacent row, thereby improving image quality.

Also, in the active area A/A of the display panel according to embodiments of the present disclosure, a plurality of emission areas emitting the same color light can be disposed in the same column.

For example, as shown in FIG. 2, the third emission areas EA3 emitting B light can be disposed in an $M^{th}$ column.

The second emission areas EA2 emitting W light can be disposed in an $(M-1)^{th}$ column adjacent to the $M^{th}$ column, and the fourth emission areas EA4 emitting G light can be disposed in an $(M+1)^{th}$ column. In addition, the first emission areas EA1 emitting R light can be disposed in an $(M-_2)^{th}$ column adjacent to the $(M-1)^{th}$ column.

One color filter can be shared by a first sub-emission area included in at least one emission area of the plurality of emission areas disposed in the plurality of rows of the active area A/A and a second sub-emission area of another emission area disposed in a row adjacent to the one emission area.

For example, the second sub-emission area EA12 of the first emission area EA1 disposed in the $(N-1)^{th}$ row and the first sub-emission area EA11 of the first emission area EA1 disposed in the $N^{th}$ row can overlap the same R color filter 211.

The second sub-emission area EA32 of the third emission area EA3 disposed in the $(N-1)^{th}$ row and the first sub-emission area EA31 of the third emission area EA3 disposed in the $N^{th}$ row can overlap the same B color filter 212.

In addition, the second sub-emission area EA42 of the fourth emission area EA4 disposed in the $(N-1)^{th}$ row and the first sub-emission area EA41 of the fourth emission area EA4 disposed in the $N^{th}$ row can overlap the same G color filter 213.

In addition, a color filter may not be disposed in the second sub-emission area EA22 of the second emission area EA2 disposed in the $(N-1)^{th}$ row and the first sub-emission area EA21 of the second emission area EA2 disposed in the Nth row. However, embodiments of the present disclosure are not limited thereto, and a color filter can be disposed.

As described above, the emission areas emitting the same color light can be disposed in the same column, and at least one repair pattern 240 can be disposed between adjacent emission areas emitting the same color light.

Such a structure will be described in detail with reference to FIGS. 3 and 4 as follows.

Figure 3:
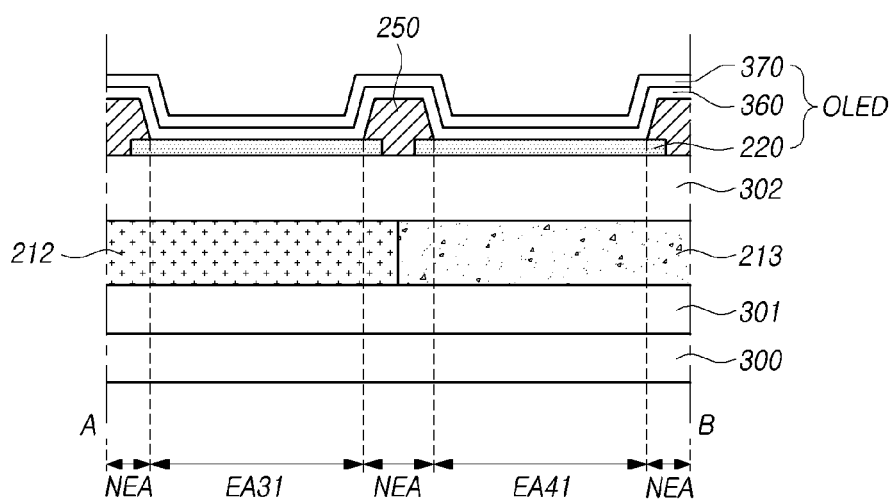
FIG. 3 is a cross-sectional view along line A-B of FIG. 2.
Figure 4:
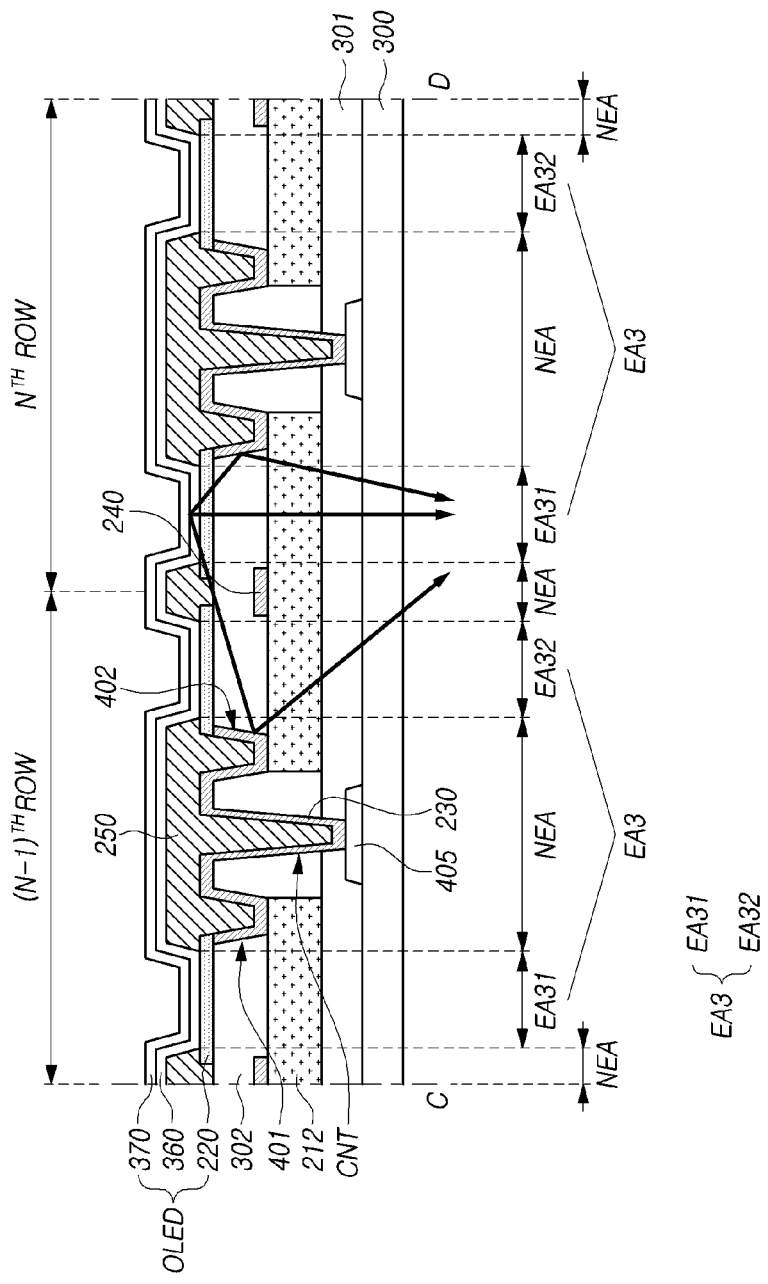
FIG. 4 is a cross-sectional view along line C-D of FIG. 2.

FIG. 3 is a cross-sectional view along line A-B of FIG. 2, and FIG. 4 is a cross-sectional view along line C-D of FIG. 2.

Specifically, FIG. 3 is a cross-sectional view in a row direction which illustrates a first sub-emission area EA31 of a third emission area EA3 and a first sub-emission area EA41 of a fourth emission area EA4 adjacent to the first sub-emission area EA31 of the third emission area EA3.

FIG. 4 is a cross-sectional view in a column direction which illustrates a plurality of third emission areas EA3 and a circuit area included in a non-emission area NEA.

In the following descriptions, contents (configurations, effects, and the like) that overlap those of the above-described embodiments can be omitted. In addition, in the following descriptions, the same reference numbers can be used for components overlapping those of the above-described embodiments.

First, referring to FIG. 3, a display panel according to embodiments of the present disclosure can include an insulating layer 301 disposed on a substrate 300.

Although the insulating layer 301 is illustrated as a single-layered structure in FIG. 3, embodiments of the present disclosure are not limited thereto, and the insulating layer 301 can have a multi-layered structure of two or more layers.

The insulating layer 301 can include an inorganic insulating material. For example, the insulating layer 301 can include at least one selected from among silicon nitride ($SiN_x$), silicon oxide ($SiO_x$), and silicon oxynitride (SiON).

Second and third color filters 212 and 213 can be disposed on the insulating layer 301. An overcoat layer 302 can be disposed on the second and third color filters 212 and 213.

A first electrode 220 of an organic light-emitting element OLED can be disposed on the overcoat layer 302. The first electrode 220 can include a transparent conductive material. For example, the first electrode 220 can include at least one selected from among indium tin oxide (ITO), indium zinc oxide (IZO), and indium gallium zinc oxide (IGZO), but the present disclosure is not limited thereto.

A bank 250 can be disposed on the overcoat layer 302 and the first electrode 220. The bank 250 can overlap a portion of an upper surface of the overcoat layer 302 and a portion of an upper surface of the first electrode 220.

In an active area A/A, an area in which the first electrode 220 does not overlap the bank 250 is an area included in the emission area, and an area in which the bank 250 is disposed is the non-emission area NEA.

An organic light-emitting layer 360 can be disposed on the first electrode 220 and the bank 250.

A second electrode 370 can be disposed on the organic light-emitting layer 360. The second electrode 370 can include a reflective conductive material. However, embodiments of the present disclosure are not limited thereto.

The organic light-emitting element OLED including the first electrode 220, the organic light-emitting layer 360, and the second electrode 370 can emit W light. While the W light emitted from the organic light-emitting element OLED passes through the color filters 212 and 213 disposed in the sub-emission areas EA31 and EA41, specific color light can be emitted to the outside of the substrate 300.

For example, referring to FIG. 3, B light can be emitted to the outside of the substrate 300 from the first sub-emission area EA31 of the third emission area EA3 in which the second color filter 212 having a B color is disposed, and G light can be emitted to the outside of the substrate 300 from the first sub-emission area EA41 of the fourth emission area EA4 in which the third color filter 213 having a G color is disposed.

Meanwhile, although FIG. 3 illustrates only a structure in which the second color filter 212 and the third color filter 213 are disposed to respectively correspond to the first sub-emission area EA31 of the third emission area EA3 and the first sub-emission area EA41 of the fourth emission area EA4, a cross-sectional structure of a second sub-emission area EA32 of the third emission area EA3 and a second sub-emission area EA42 of the fourth emission area EA4 can also be the same as that of FIG. 3.

In addition, first and second sub-emission areas EA11 and EA12 of a first emission area EA1 can also have a structure in which a substrate 300, an insulating layer 301, a color filter 211, an overcoat layer 302, a first electrode 220, a bank 250, an organic light-emitting layer 360, and a second electrode 370 are sequentially stacked as shown in FIG. 3.

First and second sub-emission areas EA21 and EA22 of a second emission area EA2 can have a structure in which a color filter is omitted from the structure shown in FIG. 3. For example, the first and second sub-emission areas EA21 and EA22 of the second emission area EA2 can have a structure in which a substrate 300, an insulating layer 301, an overcoat layer 302, a first electrode 220, a bank 250, an organic light-emitting layer 360, and a second electrode 370 are sequentially stacked.

Referring to FIG. 4, a display panel according to embodiments of the present disclosure includes a plurality of emission areas.

As shown in FIG. 4, a transistor 405 can be disposed on a substrate 300. At least one buffer layer can be disposed between the substrate 300 and the transistor 405.

The transistor 405 can include an active layer, a gate electrode, a source electrode, and a drain electrode. In addition, the transistor 405 can include a driving transistor for driving an organic light-emitting element OLED.

An insulating layer 301 can be disposed on the substrate 300 on which the transistor 405 is disposed.

A second color filter 212 can be disposed on the insulating layer 301. However, a color filter may not be disposed on the insulating layer 301 in a plurality of second emission areas EA2.

A repair pattern 240 can be disposed on the second color filter 212. An overcoat layer 302 can be disposed on the substrate 300 on which the second color filter 212 and the repair pattern 240 are disposed.

A plurality of first electrodes 220 of organic light-emitting elements OLED can be disposed on the overcoat layer 302, and a plurality of connection patterns 230 can be disposed.

A bank 250 can be disposed on the overcoat layer 302 on which the first electrode 220 and the connection pattern 230 are disposed.

An area in which the bank 250 is disposed in an active area is the non-emission area NEA of the display panel, and an area in which the bank 250 is not disposed and the first electrode 220 is disposed is an emission area EA.

An organic light-emitting layer 360 and a second electrode 370 can be sequentially disposed on the bank 250 and the first electrode 220.

The connection pattern 230 can be disposed between at least two first electrodes 220 and can be electrically connected to the at least two first electrodes 220.

The connection pattern 230 can be electrically connected to the transistor 405 disposed in the non-emission area NEA through a contact hole CNT formed in the overcoat layer 302 and the insulating layer 301.

Specifically, one end portion of the connection pattern 230 can be electrically connected to the first electrode 220 disposed in one sub-emission area (first sub-emission area EA31 of the third emission area), and the other end portion of the connection pattern 230 can be electrically connected to the first electrode 220 disposed in another adjacent sub-emission area (second sub-emission area EA32 of the third emission area).

In other words, as shown in FIG. 4, one end portion of one connection pattern 230 can be in contact with the first electrode 220 in the first sub-emission area EA31 of the third emission area EA3, and the other end portion thereof can be in contact with the first electrode 220 in the second sub-emission area EA42 of the third emission area EA3.

Due to the connection pattern 230, at least two sub-emission areas EA31 and EA32 can be driven through one circuit area.

One connection pattern 230 can have a structure for being electrically connected to the first electrode 220 disposed in each of at least two sub-emission areas EA31 and EA32 emitting the same color light.

The connection pattern 230 can include a different material from the first electrode 220.

For example, the connection pattern 230 can include a reflective conductive material. The connection pattern 230 can include one selected from among metals of aluminum (Al), gold (Au), silver (Ag), copper (Cu), tungsten (W), molybdenum (Mo), chromium (Cr), tantalum (Ta), and titanium (Ti), or an alloy thereof, but the present disclosure is not limited thereto.

The connection pattern 230 can be disposed to overlap at least one color filter. The overcoat layer 302 can include holes 401 and 402 spaced apart from the contact hole CNT and formed in the non-emission area NEA.

The overcoat layer 302 can include the holes 401 and 402 overlapping the color filters 212 in areas corresponding to peripheral portions of the color filters 212.

The connection pattern 230 disposed on the overcoat layer 302 can be formed along the holes 401 and 402 formed in the overcoat layer 302. For example, the connection pattern 230 can also be disposed inside the holes 401 and 402 of the overcoat layer 320.

The first electrodes 220 disposed around the holes 401 and 402 of the overcoat layer 302 can be connected to the connection pattern 230. For example, a portion of a rear surface of the first electrode 220 can be in contact with the connection pattern 230.

Meanwhile, a portion of light emitted from the organic light-emitting element OLED may not be extracted out of the substrate 300 but can travel to another adjacent sub-emission area to be trapped inside the display panel, which causes a problem in that the light efficiency of the display panel is lowered.

In the display device of embodiments of the present disclosure, since the connection pattern 230 including a reflective conductive material is disposed along the holes 401 and 402 of the overcoat layer 302 formed at one sides of the sub-emission areas EA31 and EA32, light emitted from the organic light-emitting element OLED does not travel to another adjacent sub-emission area, and a direction of the light can be changed into a direction toward the substrate 300. For example, since the connection pattern 230 including a reflective conductive material is disposed along the holes 401 and 402 of the overcoat layer 302 formed at one sides of the sub-emission areas EA31 and EA32, the connection pattern 230 can be a reflective pattern for changing a direction of light on at least one inclined surface of the holes 401 and 402.

For example, a portion of light emitted from the first sub-emission area EA31 of one third emission area EA3 can pass through the first electrode 220, the overcoat layer 302, the second color filter 212, and the insulating layer 301 to be extracted out of the substrate 300.

Another portion of the light emitted from the first sub-emission area EA31 of the third emission area EA3 can be reflected by the connection pattern 230, which is positioned in the first hole 401 of the overcoat layer 302 provided between the first sub-emission area EA31 of the third emission area EA3 and the circuit area for driving the first sub-emission area EA31, to be extracted out of the substrate 300.

In addition, still another portion of the light emitted from the first sub-emission area EA31 of the third emission area EA3 can pass through an area corresponding to the second sub-emission area EA32 of another adjacent third emission area EA3 and can be reflected by the connection pattern 230, which is positioned in the second hole 402 of the overcoat layer 302 provided between the second sub-emission area EA32 of another adjacent third emission area EA3 and the circuit area for driving the second sub-emission area EA32, to be extracted out of the substrate 300.

As described above, since the first sub-emission area EA31 of the third emission area EA3 and the second sub-emission area EA32 of another adjacent emission area EA3 share one second color filter 212 and emit the same color light, even when light emitted from the first sub-emission area EA31 of the third emission area EA3 is emitted from the second sub-emission area EA32 of another adjacent emission area EA3 due to the connection pattern 230 provided in the second hole 402 of the overcoat layer 302, it is possible to obtain an effect in which light can be emitted without color mixing.

In other words, since light emitted from the organic light-emitting element OLED travels from one sub-emission area to another adjacent sub-emission area, it is possible to prevent a problem in that the light efficiency of the display panel is lowered.

In addition, at least one repair pattern 240 can be disposed between at least two sub-emission areas included in one emission area. In this case, the repair pattern 240 can be disposed on the color filter.

Specifically, referring to FIG. 4, the repair pattern 240 can be disposed between the second color filter 212 and the overcoat layer 302.

The repair pattern 240 is disposed in the non-emission area NEA between the first sub-emission area EA31 of one third emission area EA3 and the second sub-emission area EA32 of another adjacent third emission area EA3.

Here, a material of the repair pattern 240 can include a material corresponding to a material of the connection pattern 230. For example, the repair pattern 240 can include one selected from among metals of aluminum (Al), gold (Au), silver (Ag), copper (Cu), tungsten (W), molybdenum (Mo), chromium (Cr), tantalum (Ta), and titanium (Ti), or an alloy thereof, but the present disclosure is not limited thereto.

A process of manufacturing such a display panel will be described with reference to FIGS. 5 to 9 as follows.

Particularly, FIGS. 5 to 9 show schematic views illustrating a manufacturing process of forming the display panel shown in FIG. 2.

Referring first to FIG. 5, a transistor 405 can be disposed on a substrate 300. An insulating layer 301 can be disposed on the substrate 300 on which the transistor 405 is disposed.

A first color filter 211, a second color filter 212, and a third color filter 213 can be formed on the insulating layer 301.

A plurality of repair patterns 240 can be disposed on portions of upper surfaces of the first to third color filters 211, 212, and 213. For example, as shown in FIG. 5, one repair pattern 240 can be disposed on one color filter 211, 212, or 213.

Meanwhile, a color filter may not be disposed in a second emission area. In this case, as shown in FIG. 5, the repair pattern 240 can be disposed on the insulating layer 301.

Thereafter, as shown in FIG. 6, an overcoat layer 302 can be disposed on the substrate 300 on which the repair patterns 240 are disposed.

A plurality of contact holes CNT can be formed in the overcoat layer 302.

The contact hole CNT formed in the overcoat layer 302 can expose a portion of a surface of a source electrode or a drain electrode of a transistor (for example, a driving transistor) included in a circuit area for driving each of emission areas EA1, EA2, EA3, and EA4.

In addition, the overcoat layer 302 can include a plurality of holes 401 and 402 spaced apart from the contact hole CNT.

The plurality of holes 401 and 402 can be formed to correspond to peripheral areas of sub-emission areas EA11, EA12, EA21, EA22, EA31, EA32, EA41, and EA42 of the emission areas EA1, EA2, EA3, and EA4.

In the sub-emission areas EA11, EA12, EA31, EA32, EA41, and EA42 of first, third, and fourth emission areas EA1, EA3, and EA4, the plurality of holes 401 and 402 can be formed to expose portions of upper surfaces of the color filters 211, 212, and 213.

In addition, in the sub-emission areas EA21 and EA22 of a second emission area EA2, the plurality of holes 401 and 402 can be formed to expose portions of an upper surface of the insulating layer 301 disposed below the overcoat layer 302.

Thereafter, as shown in FIG. 7, connection patterns 230 can be disposed on the overcoat layer 302.

The connection pattern 230 can be formed inside each of the contact hole CNT, the first hole 401, and the second hole 402 of the overcoat layer 302.

The connection patterns 230 can extend from first sub-emission areas EA11, EA21, EA31, and EA41 of the emission areas EA1, EA2, EA3, and EA4 to second sub-emission areas EA12, EA22, EA32, and EA42 of the emission areas EA1, EA2, EA3, and EA4 through the circuit areas of the emission areas EA1, EA2, EA3, and EA4.

The connection pattern 230 can be disposed only in a non-emission area NEA of an active area A/A.

Next, as shown in FIG. 8, a plurality of first electrodes 220 of organic light-emitting elements can be disposed on the overcoat layer 302.

The first electrodes 220 can overlap the sub-emission areas EA11, EA12, EA21, EA22, EA31, EA32, EA41, and EA42 of the emission areas EA1, EA2, EA3, and EA4 and can overlap portions of the non-emission area NEA.

In the non-emission area NEA, each of the first electrodes 220 can be connected to the connection pattern 230.

Accordingly, as shown in FIG. 8, the first electrodes 220 of the organic light-emitting elements disposed to correspond to the sub-emission areas can be electrically connected to the circuit areas through the connection patterns 230.

Thereafter, as shown in FIG. 9, a bank 250 can be formed to correspond to the non-emission area NEA. The bank 250 can be formed to overlap the connection pattern 230 and the repair pattern 240.

When a foreign material is generated on the display panel having such a structure, the sub-emission area is repaired through the repair pattern 240, thereby preventing the visibility of the display panel from being decreased even when the foreign material is present.

This will be described with reference to FIGS. 10 to 12 as follows.

Figure 10:
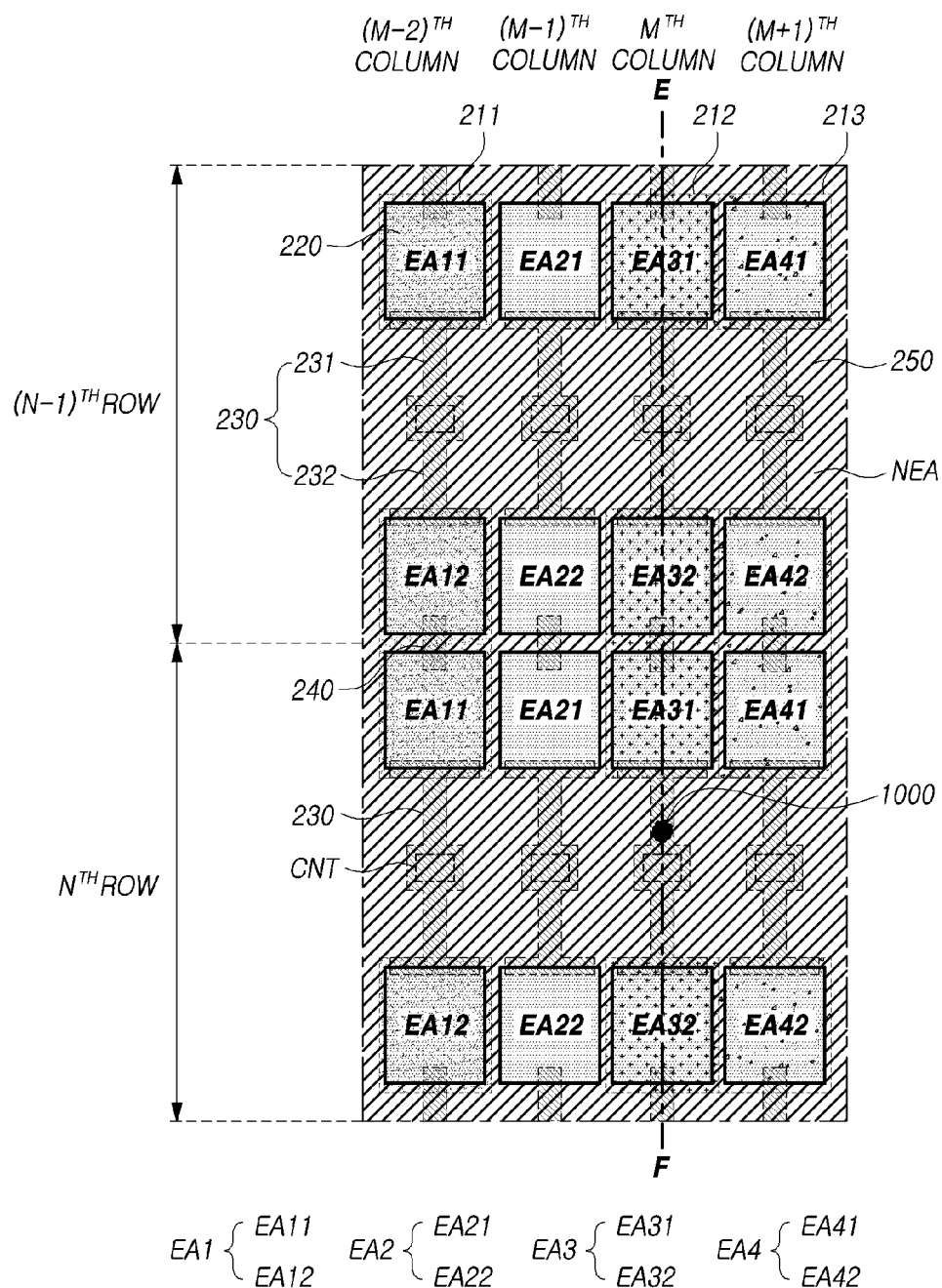
FIG. 10 is a plan view illustrating a case in which a foreign material is present on a connection pattern in the structure of FIG. 2.
Figure 11:
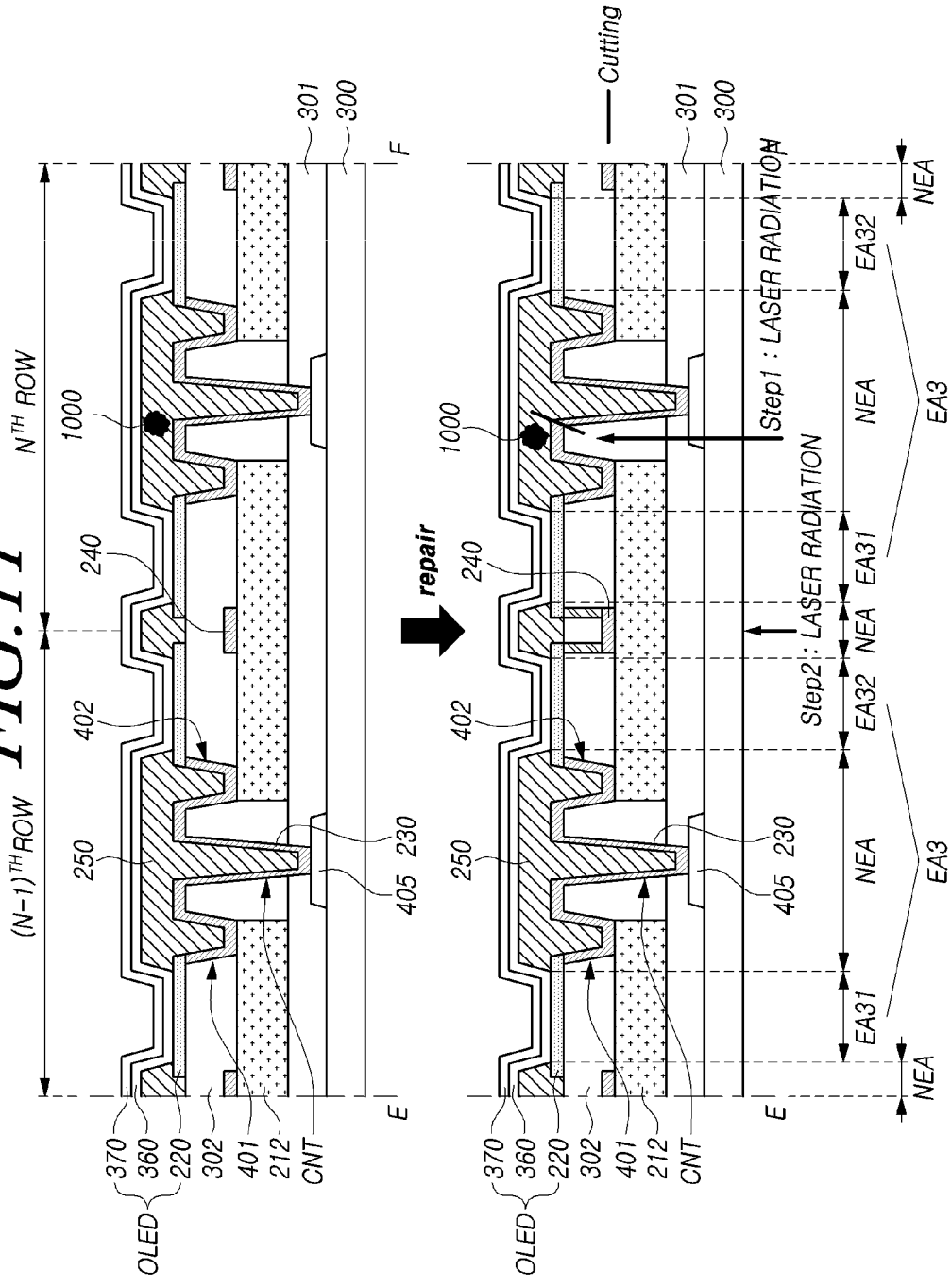
FIG. 11 shows views illustrating a repairing method in a case in which a foreign material is present on a connection pattern.

FIG. 10 is a plan view illustrating a case in which a foreign material is present on a connection pattern in the structure of FIG. 2, and FIG. 11 shows views illustrating a repairing method in a case in which a foreign material is present on the connection pattern. FIG. 12 shows views illustrating emission states when a display panel is driven after the display panel having structures of FIGS. 10 and 11 is repaired.

Referring to FIGS. 10 and 11, in a process of manufacturing a display panel according to embodiments of the present disclosure, a problem in that a foreign material 1000 is formed on a connection pattern 230 may occur.

When the foreign material 1000 is present on the connection pattern 230, a current is concentrated in the foreign material 1000, and thus a bright spot defect may be caused in sub-emission areas electrically connected to the connection pattern 230.

For example, when the foreign material 1000 is present on the connection pattern 230 in an area between a contact hole CNT and a first sub-emission area EA31 of a third emission area EA3 positioned in an $N^{th}$ row, a bright spot defect may occur in the first sub-emission area EA31 of the third emission area EA3 in the $N^{th}$ row.

In this case, as shown in FIG. 11, a laser is irradiated in a direction from a rear surface of a substrate 300 toward the connection pattern 230 to cut (disconnect) the connection pattern 230 disposed in the $N^{th}$ row (Step 1).

In this case, a cutting position of the connection pattern 230 can be a position between the foreign material 1000 and the first sub-emission area EA31 of the third emission area EA3 positioned in the $N^{th}$ row.

As described above, by cutting the connection pattern 230, an organic light-emitting element OLED disposed in the first sub-emission area EA31 of the third emission area EA3 disposed in the $N^{th}$ row can be electrically disconnected from a circuit area disposed in the $N^{th}$ row.

Accordingly, since a voltage cannot be supplied to the organic light-emitting element OLED disposed in the first sub-emission area EA31 of the third emission area EA3 disposed in the $N^{th}$ row, even when the third emission area EA3 in the $N^{th}$ row enters an on state, the first sub-emission area EA31 may not emit light.

For example, referring to FIG. 12, after the connection pattern 230 is cut, even when all sub-emission areas disposed in the $N^{th}$ row emit light, a first sub-emission area (sub-emission area positioned in the $N^{th}$ row and an $M^{th}$ column) of the third emission area EA3 disposed in the $N^{th}$ row may not emit light.

Thus, as shown in FIG. 11, a laser is irradiated toward the rear surface of the substrate 300 toward a repair pattern 240 to weld the repair pattern 240 positioned at a boundary between an $(N-1)^{th}$ row and the $N^{th}$ row, thereby connecting the repair pattern 240 to a first electrode 220 of a second sub-emission area EA32 of the third emission area EA3 in the $(N-1)^{th}$ row and a first electrode 220 of the first sub-emission area EA31 of the third emission area EA3 in the $N^{th}$ row (Step 2).

For example, the first sub-emission area EA31 of the third emission area EA3 positioned in the $N^{th}$ row can be electrically connected to a circuit area for driving the third emission area EA3 through the first electrode 220 of the second sub-emission area EA32 of the third emission area EA3 in the $(N-1)^{th}$ row.

Accordingly, as shown in FIG. 12, among the first sub-emission areas EA31 of the third emission areas EA3 positioned in the $N^{th}$ row, the first sub-emission area EA31 of the third emission area EA3 connected to the circuit area of the third emission area EA3 positioned in the $(N-1)^{th}$ row through a welding process can emit light when a voltage is applied to the $(N-1)^{th}$ row rather than the $N^{th}$ row.

As described above, even when the foreign material 1000 is present on the connection pattern 230, a defect of a specific sub-emission area can be prevented, and the specific sub-emission area can be repaired.

In addition, as shown in FIGS. 2 to 12, in a display device according to embodiments of the present disclosure, one emission area can include at least two sub-emission areas.

Even when a foreign material is present in a circuit area disposed in one row, at least two sub-emission areas are darkened and then electrically connected to a circuit area disposed in another adjacent row, thereby repairing the darkened sub-emission area.

As described above, since one emission area is divided into at least two sub-emission areas, darkening and repairing can be performed on at least one sub-emission area.

Accordingly, a first sub-emission area EA31 of a third emission area EA3 disposed in an $N^{th}$ row and an $M^{th}$ column can be darkened, and a first electrode 220 of a second sub-emission area EA32 of a third emission area EA3 disposed in an $(N-1)^{th}$ row and the $M^{th}$ column can be electrically connected to a first electrode 220 of the first sub-emission area EA31 of the third emission area EA3 disposed in the $N^{th}$ row and the $M^{th}$ column through a repair pattern 240 so that the first sub-emission area EA31 of the third emission area EA3 disposed in the $N^{th}$ row and the $M^{th}$ column can emit light when the third emission area EA3 disposed in the $(N-1)^{th}$ row and the $M^{th}$ column emits light.

Even when it is desired to emit light from a third emission area EA3 disposed in an $(N-1)^{th}$ row and an $M^{th}$ column, and it is not desired to drive a third emission area EA3 disposed in an $N^{th}$ row and the $M^{th}$ column, a repaired sub-emission area disposed in the $N^{th}$ row and the $M^{th}$ column can be driven concurrently when the third emission area EA3 disposed in the $(N-1)^{th}$ row and the $M^{th}$ column is driven.

However, in a display panel according to embodiments of the present disclosure, since one emission area is divided into at least two sub-emission areas, an area of a repaired emission area can be reduced.

For example, when one emission area is not divided into a plurality of sub-emission areas or a plurality of sub-emission areas are not electrically connected through a connection pattern, an entire third emission area EA3 can be driven by a circuit area disposed in an $(N-1)^{th}$ row and an $M^{th}$ column when a foreign material is present in the circuit area disposed in an $N^{th}$ row and the $M^{th}$ column. As described above, even when driving of an $N^{th}$ row and an $M^{th}$ column is not desired, since an entire third emission area EA3 positioned in the $N^{th}$ row and the $M^{th}$ column emits light, the visibility of a display panel can be lowered.

On the other hand, in a display panel according to exemplary embodiments of the present disclosure, when repairing is performed due to a foreign material present in a circuit area disposed in an $N^{th}$ row and an $M^{th}$ column, since a portion of a third emission area EA3 (for example, one sub-emission area) is driven by a circuit area disposed in an $(N-1)^{th}$ row and the $M^{th}$ column, even when driving of the $N^{th}$ row and the $M^{th}$ column is not desired, an emission area with a relatively small area emits light, thereby improving the visibility of the display panel.

Figure 13:
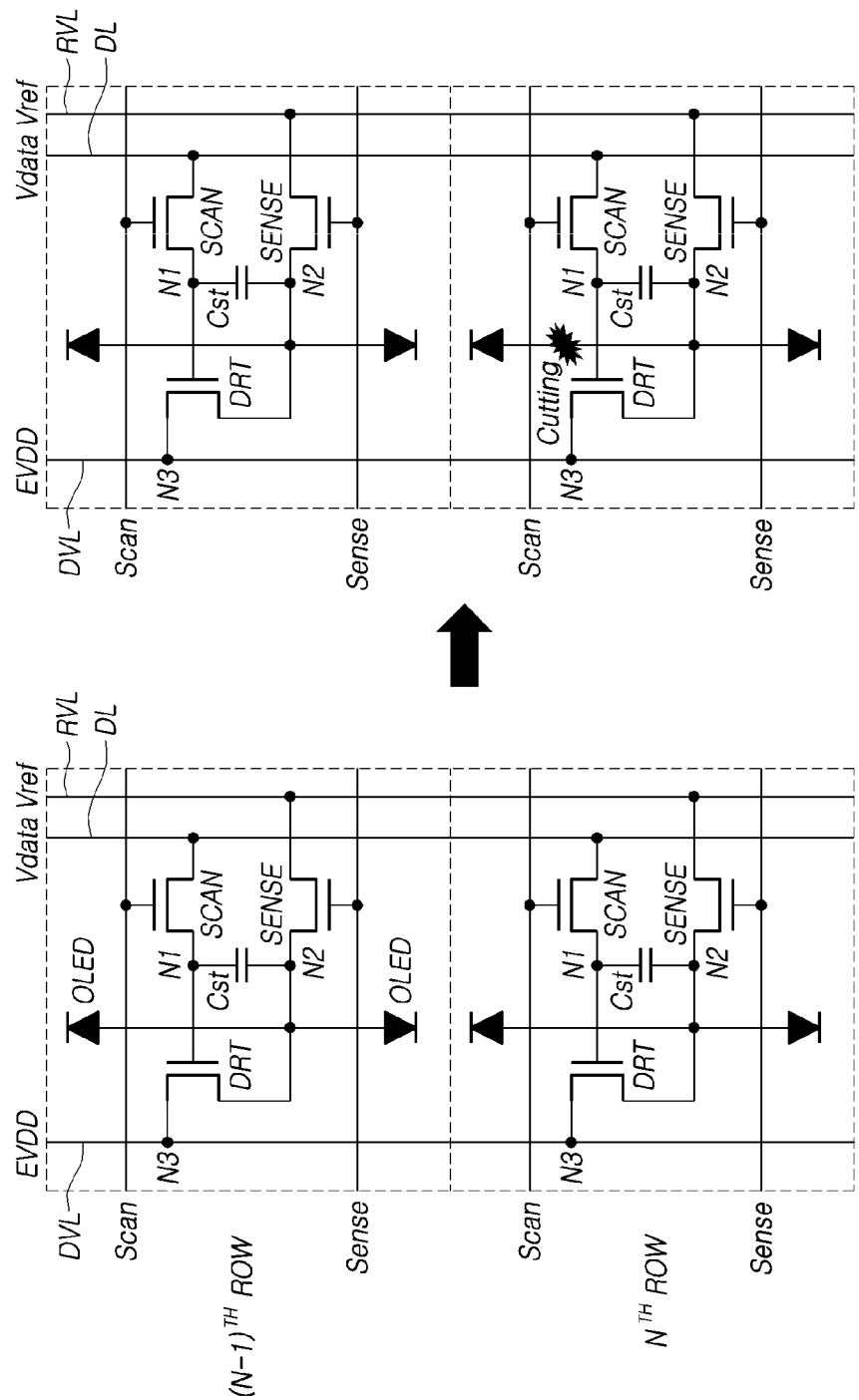
FIG. 13 shows diagrams illustrating a structure of a subpixel when a foreign material is present on a connection pattern of a display panel having the structure of FIG. 2.

FIG. 13 shows diagrams illustrating a structure of a subpixel when a foreign material is present on a connection pattern of a display panel having the structure of FIG. 2.

Referring to FIG. 13, each subpixel SP in an organic light-emitting display panel PNL can further include a second transistor T2 which transmits a data voltage Vdata to a first node N1 corresponding to a gate node of a driving transistor T1 and a storage capacitor Cst which maintains the data voltage Vdata corresponding to an image signal voltage or a voltage corresponding thereto for one frame time.

At least two organic light-emitting elements OLED included in one subpixel SP each include a first electrode (anode or cathode), an organic layer including at least one light-emitting layer, and a second electrode (cathode or anode).

As an example, a ground voltage EVSS can be applied to the second electrode of the organic light-emitting element OLED.

The driving transistor T1 supplies a driving current to the organic light-emitting element OLED to drive the organic light-emitting element OLED. The driving transistor T1 has the first node N1, a second node N2, and a third node N3.

The meaning of "nodes" of the first to third nodes N1, N2, and N3 can be points, electrode(s), or line(s) having the same electrical state.

Each of the first node N1, the second node N2, and the third node N3 can include one or more electrodes.

The first node N1 of the driving transistor T1 can be a node corresponding to a gate node and can be electrically connected to a source node or a drain node of the second transistor T2.

The second node N2 of the driving transistor T1 can be electrically connected to a first electrode 220 of the organic light-emitting element OLED and can be a source node or a drain node.

The third node N3 of the driving transistor T1 can be a node to which a driving voltage EVDD is applied, can be electrically connected to a driving voltage line DVL that supplies the driving voltage EVDD, and can be a drain node or a source node.

The driving transistor T1 and the second transistor T2 can be implemented as an n-type or a p-type.

The second transistor T2 can be electrically connected between a data line DL and the first node N1 of the driving transistor T1 and can be controlled by a scan signal SCAN that is applied to a gate node thereof through a gate line.

The second transistor T2 can be turned on by the scan signal SCAN to transmit the data voltage Vdata supplied from the data line DL to the first node N1 of the driving transistor T1.

The storage capacitor Cst can be electrically connected between the first node N1 and the second node N2 of the driving transistor T1.

The storage capacitor Cst is not a parasitic capacitor (for example, Cgs or Cgd) which is an internal capacitor present between the first node N1 and the second node N2 of the driving transistor T1 and is an external capacitor which is intentionally designed outside the driving transistor T1.

A third transistor T3 can be electrically connected between the second node N2 of the driving transistor T1 and a reference voltage line RVL and can be controlled and turned on/off by a second scan signal SCAN2 that is applied to a gate node thereof.

A drain node or source node of the third transistor T3 can be electrically connected to the reference voltage line RVL, and the source node or drain node of the third transistor T3 can be electrically connected to the second node N2 of the driving transistor T1.

As an example, the third transistor T3 can be turned on in a display driving period and can be turned on in a sensing driving period for sensing a characteristic value of the driving transistor T1 or a characteristic value of the organic light-emitting element OLED.

The third transistor T3 can be turned on by the second scan signal SCAN2 according to a corresponding driving timing (for example, a display driving timing or an initialization timing within a sensing driving period) and can transmit a reference voltage Vref supplied to the reference voltage line RVL to the second node N2 of the driving transistor T1.

In addition, the third transistor T3 can be turned on by the second scan signal SCAN2 according to a corresponding driving timing (for example, a sampling timing within a sensing driving period) and can transmit a voltage of the second node N2 of the driving transistor T1 to the reference voltage line RVL.

In other words, the third transistor T3 can control a voltage state of the second node N2 of the driving transistor T1 or can transmit the voltage of the second node N2 of the driving transistor T1 to the reference voltage line RVL.

Here, the reference voltage line RVL can be electrically connected to an ADC which senses a voltage of the reference voltage line RVL and converts the sensed voltage into a digital value to output sensing data including the digital value.

The ADC can be included in an SDIC implementing a data driver DDR.

The sensing data output from the ADC can be used to sense the characteristic value (for example, a threshold voltage or mobility) of the driving transistor T1 or the characteristic value (for example, a threshold voltage) of the organic light-emitting element OLED.

Each of the driving transistor T1, the second transistor T2, and the third transistor T3 can be an n-type transistor or a p-type transistor.

Meanwhile, the first scan signal SCAN1 and the second scan signal SCAN2 can be separate gate signals. In this case, the first scan signal SCAN1 and the second scan signal SCAN2 can be respectively applied to the gate node of the second transistor T2 and the gate node of the third transistor T3 through different gate lines.

In some cases, the first scan signal SCAN1 and the second scan signal SCAN2 can be the same gate signal. In this case, the first scan signal SCAN1 and the second scan signal SCAN2 can be commonly applied to the gate node of the second transistor T2 and the gate node of the third transistor T3 through the same gate line.

The structure of each subpixel illustrated in FIG. 13 is merely an example for description, and each subpixel can further include one or more transistors or one or more storage capacitors in some cases.

Alternatively, a plurality of subpixels can have the same structure, or some of the plurality of subpixels can have a different structure.

In addition, as described with reference to FIGS. 10 to 12, when a foreign material is present on a connection pattern disposed in an $N^{th}$ row, one of at least two organic light-emitting elements OLED disposed in the $N^{th}$ row can be cut to prevent a bright spot defect from occurring.

A structure in which one emission area EA includes two sub-emission areas has been mainly described with reference to FIGS. 2 to 13, but the structures of embodiments of the present disclosure is not limited thereto.

As shown in FIGS. 14 to 23, one emission area can include at least four sub-emission areas.

Figure 14:
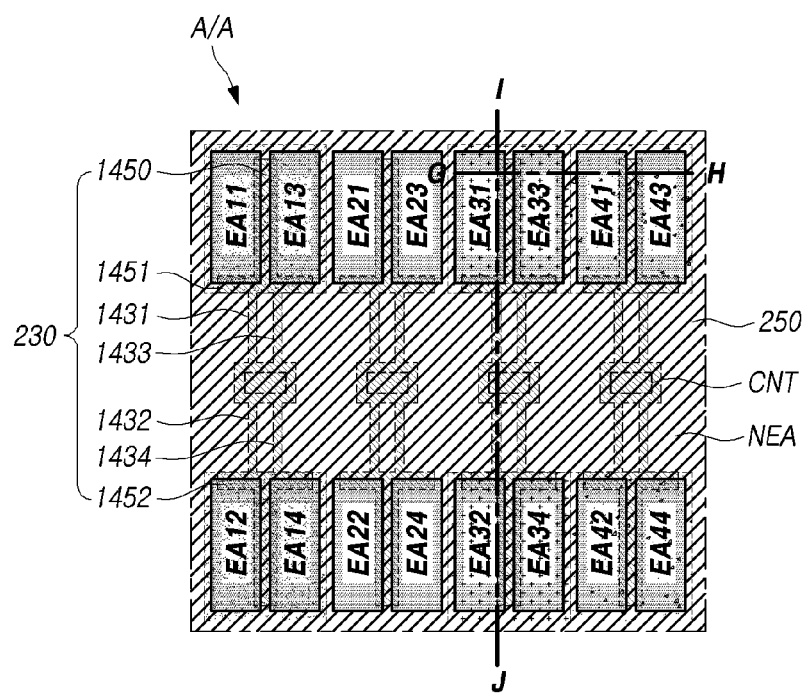
FIG. 14 is a schematic plan view illustrating a structure of a partial area of an active area in a display panel according to other embodiments of the present disclosure.

FIG. 14 is a schematic plan view illustrating a structure of a partial area of an active area in a display panel according to other embodiments of the present disclosure.

In the following descriptions, contents (configurations, effects, and the like) that overlap those of the above-described embodiments can be omitted. In addition, in the following descriptions, the same reference numbers can be used for components overlapping those of the above-described embodiments.

Referring to FIG. 14, an active area A/A of the display panel according to other embodiments of the present disclosure can include a plurality of emission areas EA1, EA2, EA3, and EA4 and a non-emission area NEA surrounding the emission areas EA1, EA2, EA3, and EA4.

The plurality of emission areas EA1, EA2, EA3, and EA4 can include a first emission area EA1, a second emission area EA2, a third emission area EA3, and a fourth emission area EA4.

The first emission area EA1 can include first to fourth sub-emission areas EA11, EA12, EA13, and EA14, the second emission area EA2 can include first to fourth sub-emission areas EA21, EA22, EA23, and EA24, the third emission area EA3 can include first to fourth sub-emission areas EA31, EA32, EA33, and EA34, and the fourth emission area EA4 can include first to fourth sub-emission areas EA41, EA42, EA43, and EA44.

A plurality of sub-emission areas included in each of the emission areas EA1, EA2, EA3, and EA4 can be disposed apart from each other.

For example, as shown in FIG. 14, the first to fourth sub-emission areas EA11, EA12, EA13, and EA14 included in the first emission area EA1 can be disposed apart from each other. In addition, the first to fourth sub-emission areas EA21, EA22, EA23, and EA24 included in the second emission area EA2 can be disposed apart from each other, and the first to fourth sub-emission areas EA31, EA32, EA33, and EA34 included in the third emission area EA3 can be disposed apart from each other. In addition, the first to fourth sub-emission areas EA41, EA42, EA43, and EA44 included in the fourth emission area EA4 can also be disposed apart from each other.

Each of the first to fourth emission areas EA1, EA2, EA3, and EA4 including the plurality of sub-emission areas can be driven through one circuit area.

The plurality of emission areas EA1, EA2, EA3, and EA4 can be disposed in a plurality of rows and a plurality of columns in the active area A/A.

In one row of the active area A/A, the first emission area EA1 can include the first sub-emission area EA11 and the third sub-emission area EA13 which are disposed in a first sub-row and are spaced apart from each other. The first emission area EA1 can include the second sub-emission area EA12 and the fourth sub-emission area EA14 which are disposed in a second sub-row adjacent to the first sub-row and are spaced apart from each other. A circuit area for driving the first emission area EA1 can be disposed between the first and third sub-emission areas EA11 and EA13 and the second and fourth sub-emission areas EA12 and EA14.

In addition, as shown in FIG. 14, the second to fourth emission areas EA2, EA3, and EA4 can also have a structure corresponding to that of the first emission area EA1.

Each of circuit areas for driving the emission areas EA1, EA2, EA3, and EA4 can include at least one connection pattern 230.

The connection pattern 230 can serve to electrically connect the sub-emission areas of each of the emission areas EA1, EA2, EA3, and EA4 to the circuit area.

The connection pattern 230 can be electrically connected to a transistor positioned in the circuit area through a contact hole CNT formed in an insulating layer disposed below the connection pattern 230.

In addition, the connection patterns 230 can include first connection patterns 1431 connected to the first sub-emission areas EA11, EA21, EA31, and EA41, second connection patterns 1432 connected to the second sub-emission areas EA21, EA22, EA32, and EA42, third connection patterns 1433 connected to the third sub-emission areas EA13, EA23, EA33, and EA43, and fourth connection patterns 1434 connected to the fourth sub-emission areas EA14, EA24, EA34, and EA44.

As described above, the first to fourth connection patterns 1431, 1432, 1433, and 1434 can be electrically connected to the sub-emission areas so that the first to fourth emission areas EA1, EA2, EA3, and EA4 including the plurality of sub-emission areas can be driven through one circuit area.

The connection pattern 230 can include an area 1451 (hereinafter, referred to as a first area) which is formed integrally with the first and third connection patterns 1431 and 1433 and are disposed at one side of the first and third sub-emission areas in the first sub-row of each of the emission areas EA1, EA2, EA3, and EA4. In addition, the connection pattern 230 can include an area 1452 (hereinafter, referred to as a second area) which is formed integrally with the second and fourth connection patterns 1432 and 1434 and are disposed at one side of the second and fourth sub-emission areas in the second sub-row of each of the emission areas EA1, EA2, EA3, and EA4.

Furthermore, the connection pattern 230 can include at least one reflective pattern 1450 disposed between adjacent sub-emission areas in the same sub-row of each of the emission areas. Specifically, in the same sub-row, the reflective pattern 1450 can be disposed between sub-emission areas emitting the same color light. The reflective pattern 1450 can be formed integrally with the first area 1451 or can be formed integrally with the second area 1452.

For example, as shown in FIG. 14, at least one reflective pattern 1450 can be disposed between the first sub-emission area EA11 and the third sub-emission area EA13 disposed in the first sub-row of the first emission area EA1.

In addition, at least one reflective pattern 1450 can be disposed between the second sub-emission area EA12 and the fourth sub-emission area EA14 disposed in the second sub-row of the first emission area EA1.

The reflective pattern 1450 can also be applied to the second to fourth emission areas EA2, EA3, and EA4 in a structure corresponding to that of the first emission area EA1.

In other words, the connection pattern 230 can include the first to fourth connection patterns 1431, 1432, 1433, and 1434, the first area 1451, the second area 1452, and the reflective pattern 1450.

Such a structure will be described in detail with reference to FIGS. 15 and 16 as follows.

Figure 15:
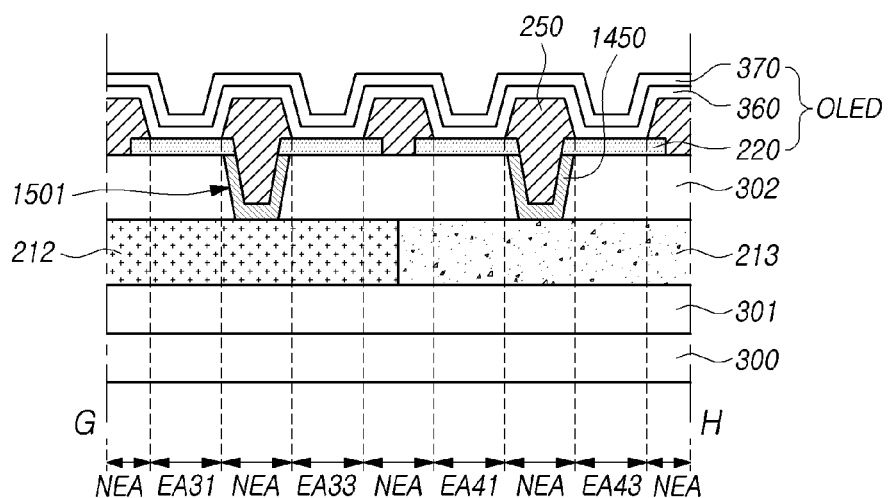
FIG. 15 is a cross-sectional view along line G-H of FIG. 14.
Figure 16:
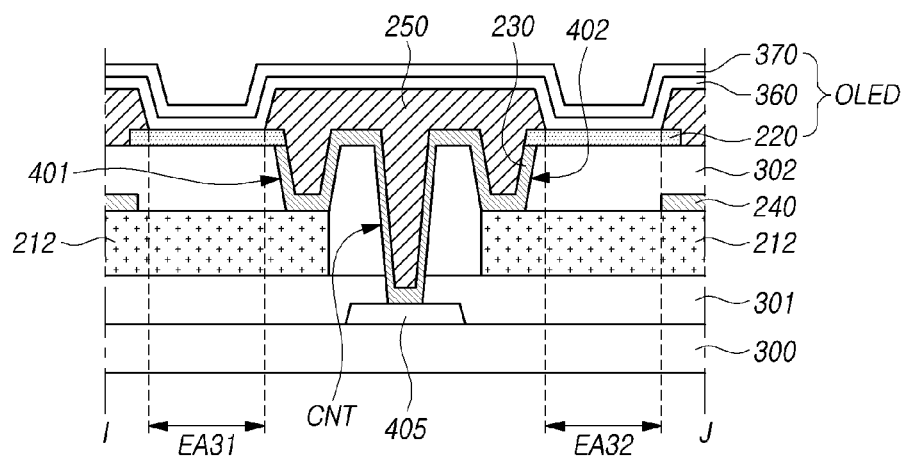
FIG. 16 is a cross-sectional view along line I-J of FIG. 14.

FIG. 15 is a cross-sectional view along line G-H of FIG. 14, and FIG. 16 is a cross-sectional view along line I-J of FIG. 14.

Specifically, FIG. 15 is a cross-sectional view in a row direction which illustrates a first and third sub-emission areas EA31 and EA33 of a third emission area EA3 and a first and third sub-emission areas EA41 and EA43 of a fourth emission area EA4 adjacent to the third emission area EA3.

FIG. 16 is a cross-sectional view in a column direction which illustrates the first and second sub-emission areas EA31 and EA32 of the third emission area EA3 and a circuit area included in a non-emission area NEA.

In the following descriptions, contents (configurations, effects, and the like) that overlap those of the above-described embodiments can be omitted. In addition, in the following descriptions, the same reference numbers can be used for components overlapping those of the above-described embodiments.

First, referring to FIG. 15, an insulating layer 301 can be disposed on a substrate 300, second and third color filters 212 and 213 can be disposed on the insulating layer 301, and an overcoat layer 302 can be disposed on the second and third color filters 212 and 213.

A plurality of first electrodes 220 disposed to correspond to sub-emission areas EA31, EA33, EA41, and EA43 can be disposed on the overcoat layer 302.

In addition, the overcoat layer 302 can include one or more third holes 1501 formed therein.

The third hole 1501 can be formed between sub-emission areas emitting the same color light.

A reflective pattern 1450 can be disposed in the third hole 1501.

The reflective pattern 1450 can include a reflective conductive material. For example, the reflective pattern 1450 can include one selected from among metals of aluminum (Al), gold (Au), silver (Ag), copper (Cu), tungsten (W), molybdenum (Mo), chromium (Cr), tantalum (Ta), and titanium (Ti), or an alloy thereof, but the present disclosure is not limited thereto.

A portion of the reflective pattern 1450 disposed between the first emission area EA31 and the third sub-emission area EA33 of the third emission area EA3 can be in contact with a portion of the first electrode 220 disposed in the first sub-emission area EA31 of the third emission area EA3, and another portion of the reflective pattern 1450 can be in contact with a portion of the first electrode 220 disposed in the third sub-emission area EA33 of the third emission area EA3.

In addition, a portion of the reflective pattern 1450 disposed between the first emission area EA41 and the third sub-emission area EA43 of the fourth emission area EA4 can be in contact with a portion of the first electrode 220 disposed in the first sub-emission area EA41 of the fourth emission area EA4, and another portion of the reflective pattern 1450 can be in contact with a portion of the first electrode 220 disposed in the third sub-emission area EA43 of the fourth emission area EA4.

As described above, since the reflective pattern 1450 is disposed between the sub-emission areas emitting the same color, a portion of light emitted from the sub-emission area reaches the reflective pattern 1450 and is reflected toward the substrate 300, thereby increasing an amount of light extracted out of the substrate 300.

In addition, a bank 250 can be disposed on the overcoat layer 302 on which the first electrode 220 and the reflective pattern 1450 are disposed.

An organic light-emitting layer 360 and a second electrode 370 can be sequentially disposed on the substrate 300 on which the bank 250 is disposed.

Meanwhile, the reflective pattern 1450 can overlap the bank 250.

A portion of the reflective pattern 1450 in contact with the first electrode 220 can be positioned in the non-emission area NEA. Accordingly, the reflective pattern 1450 has an effect of improving light extraction efficiency without reducing an area of the emission areas.

As shown in FIG. 16, a transistor 405 can be disposed on a substrate 300.

An insulating layer 301 and a second color filter 212 can be sequentially disposed on the substrate 300 on which the transistor 405 is disposed, and an overcoat layer 302 can be disposed on the insulating layer 301 on which the color filter 212 is disposed.

A plurality of first electrodes 220 of organic light-emitting elements OLED can be disposed on the overcoat layer 302, and a plurality of connection patterns 230 can be disposed.

A bank 250 can be disposed on the overcoat layer 302 on which the first electrodes 220 and the connection pattern 230 are disposed.

An organic light-emitting layer 360 and a second electrode 370 can be sequentially disposed on the bank 250 and the first electrodes 220.

One end portion of the connection pattern 230 can be electrically connected to the first electrode 220 disposed in one sub-emission area (first sub-emission area EA31 of the third emission area), and the other end portion of the connection pattern 230 can be electrically connected to the first electrode 220 disposed in another adjacent sub-emission area (second sub-emission area EA32 of the third emission area).

In other words, as shown in FIG. 16, one end portion of one connection pattern 230 (corresponding to the first connection pattern of FIG. 14) can be in contact with the first electrode 220 in the first sub-emission area EA31 of the third emission area EA3, and the other end portion of the connection pattern 230 (corresponding to the third connection pattern of FIG. 14) can be in contact with the first electrode 220 in the second sub-emission area EA32 of the third emission area EA3.

The overcoat layer 302 can include holes 401 and 402 spaced apart from a contact hole CNT and formed in the non-emission area NEA.

The connection pattern disposed in the contact hole CNT can extend to be disposed in the holes 401 and 402 of the overcoat layer 302.

The first electrodes 220 disposed around the holes 401 and 402 of the overcoat layer 302 can be connected to the connection pattern 230. For example, a portion of a rear surface of the first electrode 220 can be in contact with the connection pattern 230.

The connection pattern 230 not only enables the plurality of sub-emission areas EA31 and EA32 to be driven through one circuit area but also enables light trapped inside a display panel to be extracted out of the substrate 300 through the connection pattern 230 disposed in the holes 401 and 402 of the overcoat layer 302. For example, since the connection pattern 230 is disposed along the holes 401 and 402 of the overcoat layer 302 formed in one sides of the sub-emission areas EA31 and EA32, the connection pattern 230 can be a reflective pattern which changes a direction of light on at least one inclined surface of the holes 401 and 402.

Figure 17:
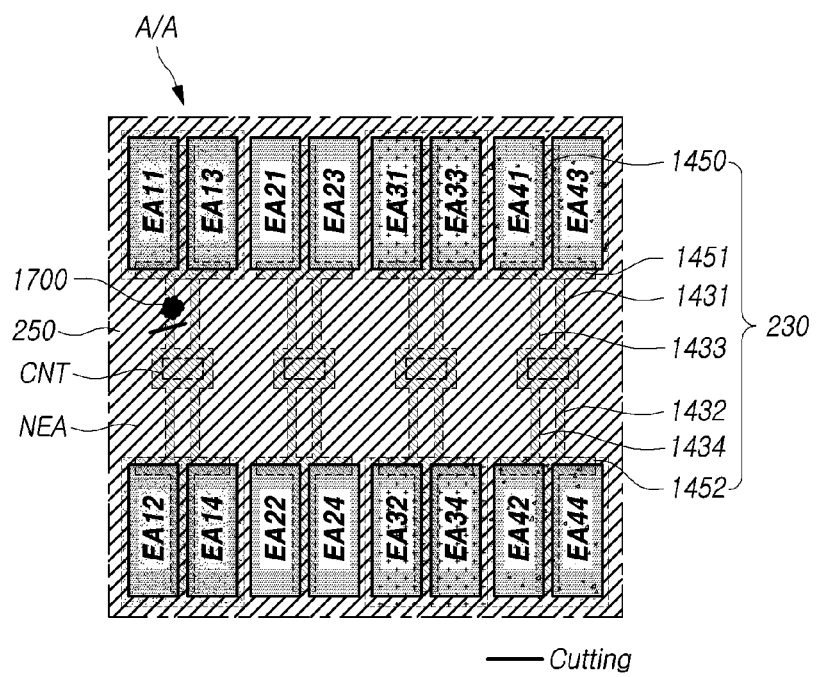
FIGS. 17 and 18 are views illustrating an example in which, when a defect occurs in a display panel having a structure of FIG. 14, the display panel is normalized.
Figure 18:
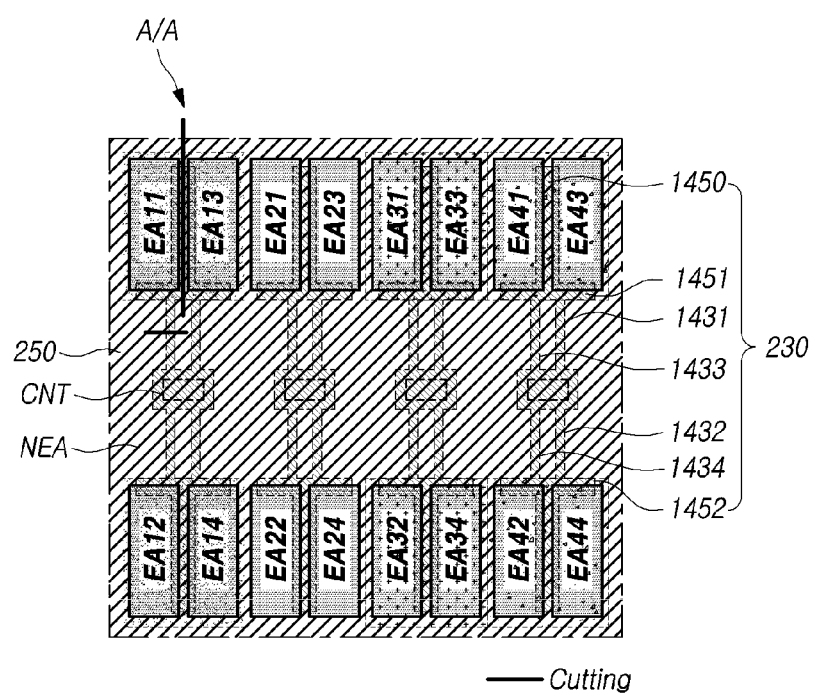

FIGS. 17 and 18 are views illustrating an example in which, when a defect occurs in a display panel having a structure of FIG. 14, the display panel is normalized.

First, referring to FIG. 17, when a foreign material 1700 is present on at least one connection pattern (for example, a first connection pattern 1431 connected to a first sub-emission area EA11 of a first emission area EA1), the connection pattern on which the foreign material 1700 is present can be cut using a laser.

As shown in FIG. 17, a first electrode 220 disposed in the first sub-emission area EA11 of the first emission area EA1 can be in a state of being electrically connected to a first electrode 220, which is disposed in a third sub-emission area EA13 of the first emission area EA1 disposed in the same sub-row, through a reflective pattern 1450.

As such, even when the first connection pattern 1431 is cut, when the first emission area EA1 is in an on state, a voltage supplied from a circuit area can be applied to the first sub-emission area EA11 of the first emission area EA1 through a third connection pattern 1433, the first electrode of the third sub-emission area EA13, and the reflective pattern 1450.

Accordingly, visibility can be prevented from being lowered because the sub-emission area does not emit light.

In addition, as shown in FIG. 18, when a defect occurs in the first sub-emission area EA11 itself of the first emission area EA1 due to a foreign material or the like, the connection pattern 230 and the reflective pattern 1450 positioned between the first emission area EA11 and the third sub-emission area EA13 of the first emission area EA1 are cut using a laser, thereby preventing a defect from occurring in the first sub-emission area EA11 of the first emission area EA1.

As described above, even when one sub-emission area is disconnected from a circuit area, since one emission area is divided into at least four sub-emission areas, an area in which light is not emitted is reduced to ¼ of an area in which the entirety of one emission area is disconnected and light is not emitted, thereby improving the visibility of a display panel.

Further, by adding a repair pattern in a display panel having a structure of FIGS. 14 to 16, a sub-emission area can be repaired through a repair process even when a foreign material is generated.

This will be described with reference to FIGS. 19 to 22 as follows.

Figure 19:
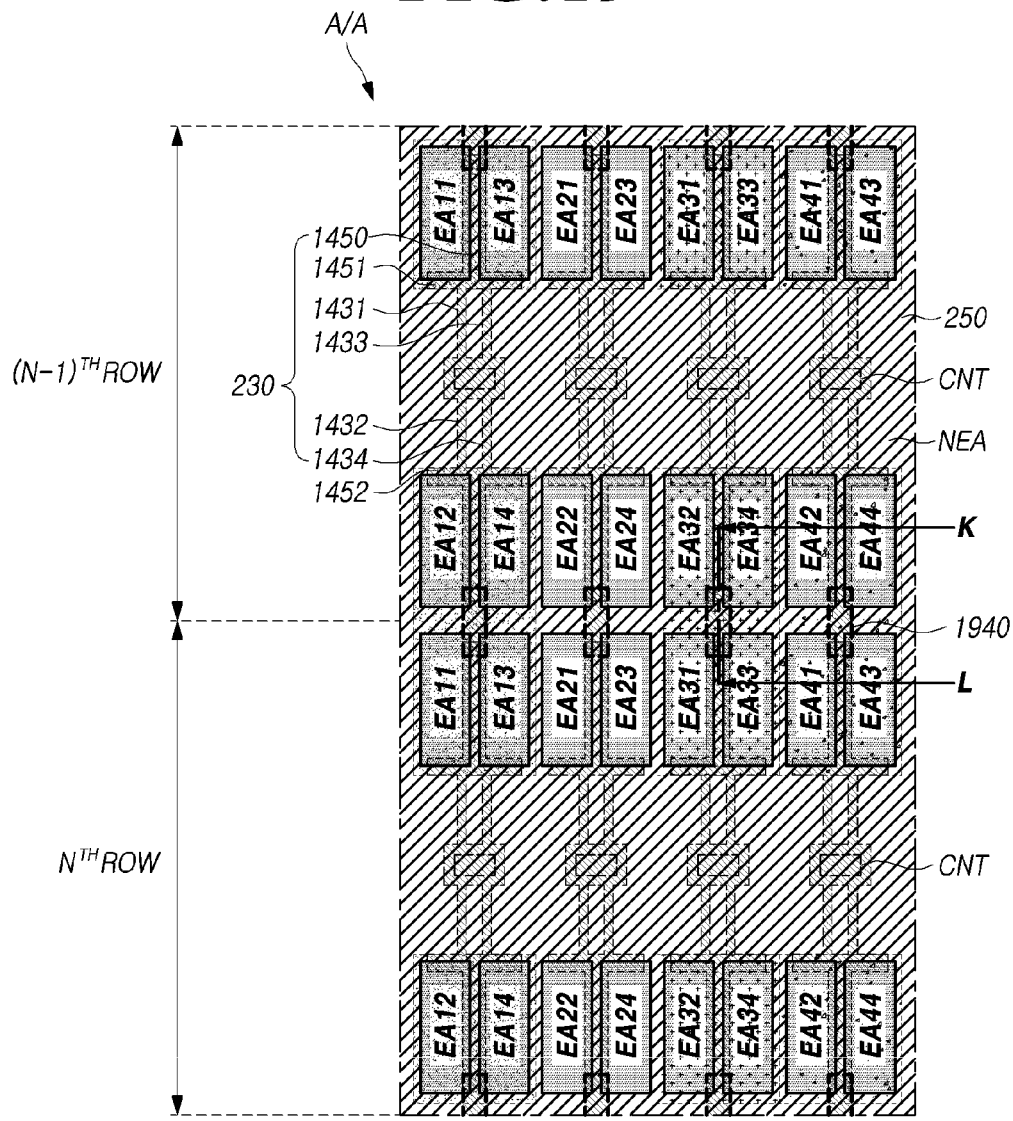
FIG. 19 is a view illustrating a structure in which a repair pattern is added to the structure of FIG. 14.
Figure 20:
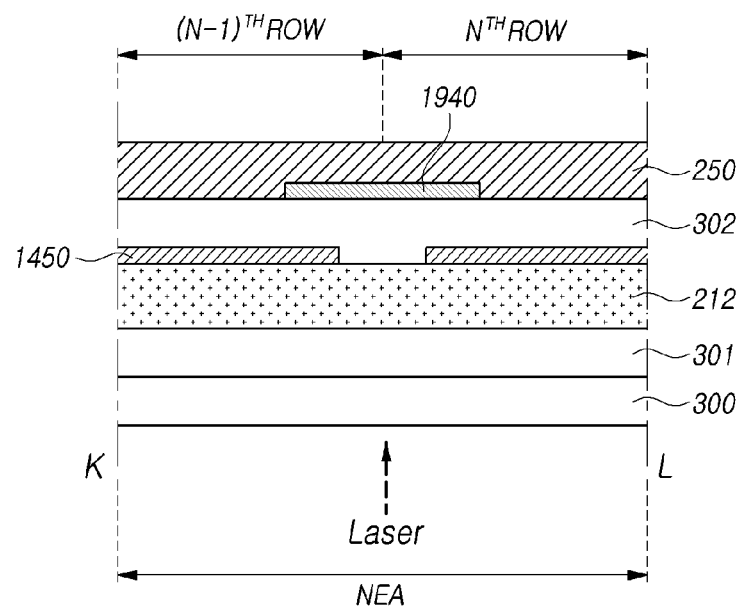
FIG. 20 is a cross-sectional view along line K-L of FIG. 19.
Figure 21:
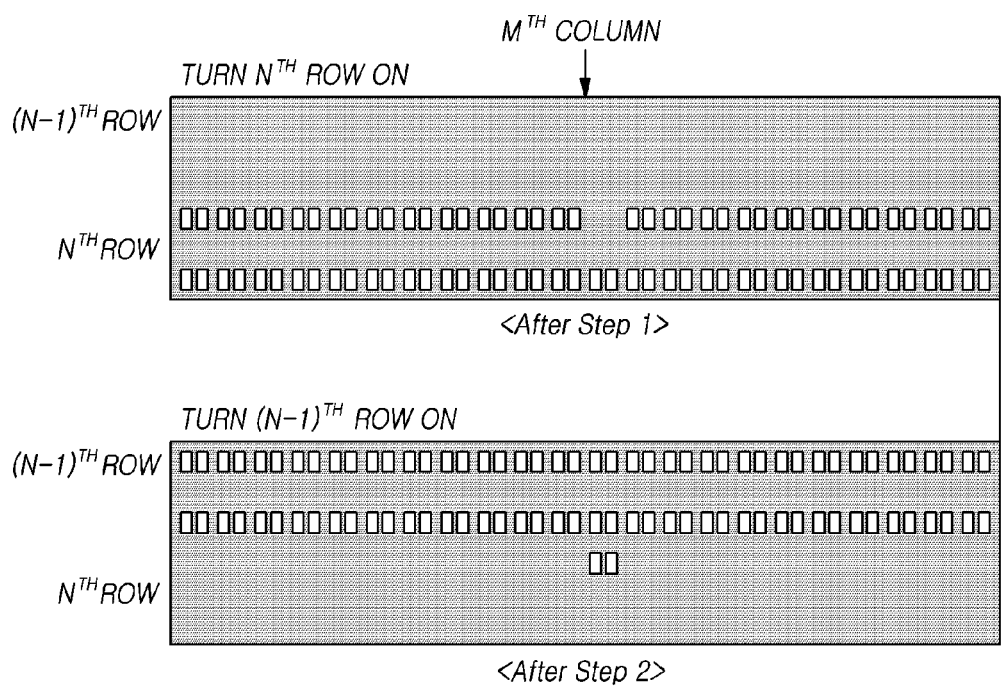
FIG. 21 shows views illustrating emission states when a display panel having the structure of FIGS. 19 and 20 is driven before and after the display panel is repaired.

FIG. 19 is a view illustrating a structure in which a repair pattern is added to the structure of FIG. 14. FIG. 20 is a cross-sectional view along line K-L of FIG. 19. FIG. 21 shows views illustrating emission states when a display panel having the structure of FIGS. 19 and 20 is driven before and after the display panel is repaired.

The structure of FIG. 19 can be the same as the structure of the first to fourth emission areas EA1, EA2, EA3, and EA4 and the non-emission area NEA described with reference to FIG. 14.

However, as shown in FIG. 19, the display panel according to embodiments of the present disclosure can further include a repair pattern 1940 disposed between emission areas disposed in an $(N-1)^{th}$ row and an $N^{th}$ row.

Specifically, the repair pattern 1940 can be disposed between a first emission area EA1 disposed in the $(N-1)^{th}$ row and a first emission area EA1 disposed in the $N^{th}$ row.

One repair pattern 1940 can overlap one reflective pattern 1450 arranged in the $(N-1)^{th}$ row and can also overlap one reflective pattern 1450 disposed in the $N^{th}$ row.

For example, as shown in FIG. 19, a portion of one repair pattern 1940 can overlap a reflective pattern 1450 disposed between a second sub-emission area EA12 and a fourth sub-emission area EA14 of a first emission area EA1 disposed in the $(N-1)^{th}$ row and can also overlap a reflective pattern 1450 disposed between a first sub-emission area EA11 and a third sub-emission area EA13 of a first emission area EA1 disposed in the $N^{th}$ row. In this case, one repair pattern 1940 can also overlap one first color filter 211.

In addition, a portion of another repair pattern 1940 can overlap a reflective pattern 1450 disposed between a second sub-emission area EA22 and a fourth sub-emission area EA24 of a second emission area EA2 disposed in the $(N-1)^{th}$ row and can also overlap a reflective pattern 1450 disposed between a first sub-emission area EA21 and a third sub-emission area EA23 of a second emission area EA2 disposed in the $N^{th}$ row.

Furthermore, as shown in FIGS. 19 and 20, a portion of still another repair pattern 1940 can overlap a reflective pattern 1450 disposed between a second sub-emission area EA32 and a fourth sub-emission area EA34 of a third emission area EA3 positioned in the $(N-1)^{th}$ row and can also overlap a reflective pattern 1450 disposed between a first sub-emission area EA31 and a third sub-emission area EA33 of a third emission area EA3 disposed in the $N^{th}$ row. In this case, one repair pattern 1940 can also overlap one second color filter 212.

As shown in FIG. 19, a portion of yet another repair pattern 1940 can overlap a reflective pattern 1450 disposed between a second sub-emission area EA42 and a fourth sub-emission area EA44 of a fourth emission area EA4 disposed in the $(N-1)^{th}$ row and can also overlap a reflective pattern 1450 disposed between a first sub-emission area EA41 and a third sub-emission area EA43 of a fourth emission area EA4 disposed in the $N^{th}$ row. In this case, one repair pattern 1940 can also overlap one third color filter 213.

As shown in FIG. 20, the repair pattern 1940 can be disposed on an overcoat layer 302. The reflective pattern 1450 can be disposed below the overcoat layer 302.

Meanwhile, in the structure of the display panel shown in FIG. 19, when a foreign material is present on one connection pattern 230, a sub-emission area connected to the connection pattern 230 can be normally operated through cutting of the connection pattern 230 and repairing using the repair pattern 1940.

For example, when a foreign material is present on a first connection pattern 1431 and a third connection pattern 1433, which are connected to the first and third sub-emission areas EA31 and EA33 of the third emission area EA3, in the connection pattern 230 positioned in the $N^{th}$ row and an $M^{th}$ column of FIG. 19, in order to prevent a bright spot defect from occurring in the first and third sub-emission areas EA31 and EA33 of the third emission area EA3, the first connection pattern 1431 and the third connection pattern 1433 can be disconnected from a circuit area using a laser (Step 1).

In this case, as shown in FIG. 21, even when a signal is applied to the $N^{th}$ row, the first and third sub-emission areas EA31 and EA33 of the third emission area EA3 positioned in the $N^{th}$ row and the $M^{th}$ column do not emit light.

Thereafter, in order to repair the first and third sub-emission areas EA31 and EA33 of the third emission area EA3, as shown in FIGS. 19 and 20, a laser can be irradiated onto the repair pattern 1940 overlapping the second and fourth emission areas EA32 and EA34 of the third emission area EA3 positioned in the $(N-1)^{th}$ row and the $M^{th}$ column and the first and third sub-emission areas EA31 and EA33 of the third emission area EA3 positioned in the $N^{th}$ row and the $M^{th}$ column.

After the laser is irradiated, the repair pattern 1940 shown in FIG. 20 can be connected to the reflective patterns 1450 disposed below the repair pattern 1940.

Since a first electrode 220 disposed to correspond to the second and fourth sub-emission areas EA32 and EA34 of the third emission area EA3 disposed in the $(N-1)^{th}$ row and the $M^{th}$ column is in a state of being in contact with the repair pattern 1940 overlapping the second and fourth emission areas EA32 and EA34 of the third emission area EA3 positioned in the $(N-1)^{th}$ row and the $M^{th}$ column and the first and third sub-emission areas EA31 and EA33 of the third emission area EA3 positioned in the $N^{th}$ row and the $M^{th}$ column, the first and third sub-emission areas EA31 and EA33 of the third emission area EA3 positioned in the $N^{th}$ row and the $M^{th}$ column can be electrically connected to a circuit area for driving the third emission area EA3 positioned in the $(N-1)^{th}$ row and the $M^{th}$ column.

Accordingly, as shown in FIG. 21, after repairing is performed (after Step 2), when the third emission area EA3 disposed in the $(N-1)^{th}$ row and the $M^{th}$ column is driven, the first and third sub-emission areas EA31 and EA33 of the third emission area EA3 disposed in the $N^{th}$ row and the $M^{th}$ column can also be driven.

For example, even when a foreign material is generated on the connection pattern 230, all sub-emission areas can emit light without sub-emission areas that do not emit light.

A structure in which one repair pattern 1940 per four sub-emission areas is disposed has been mainly described with reference to FIGS. 19 to 21, but embodiments of the present disclosure are not limited thereto.

Figure 22:
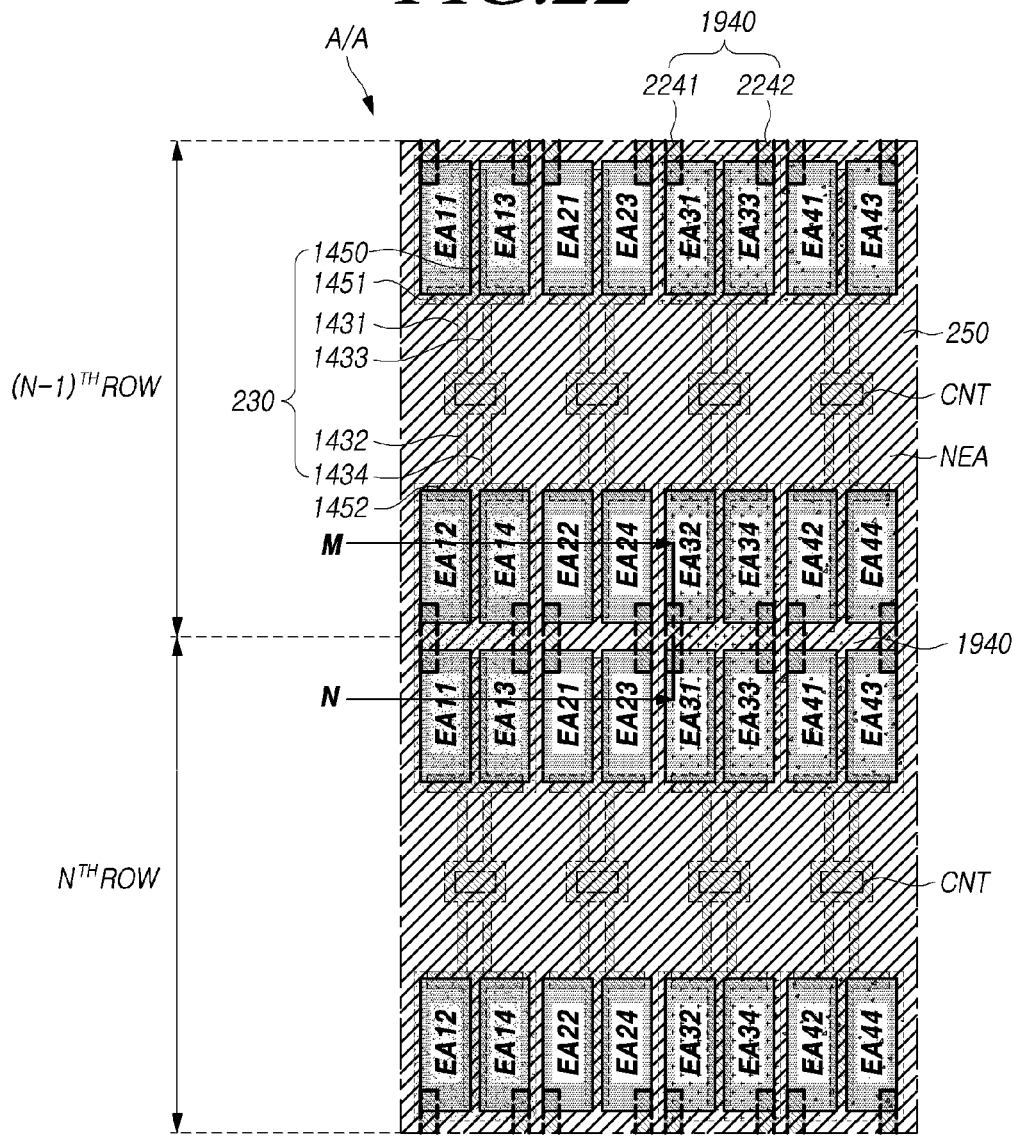
FIG. 22 is a view illustrating a structure in which two repair patterns per four sub-emission areas are disposed in the structure of FIG. 14.
Figure 23:
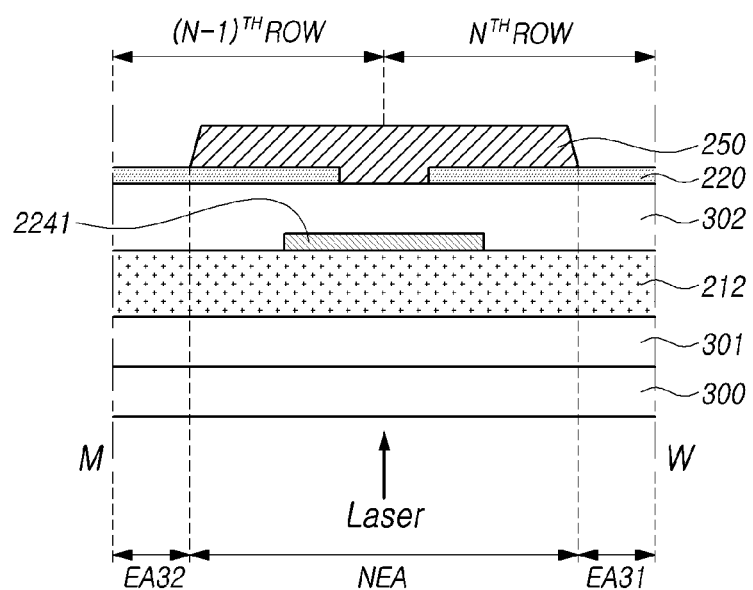
FIG. 23 is a cross-sectional view along line M-N of FIG. 22.

FIG. 22 is a view illustrating a structure in which two repair patterns per four sub-emission areas are disposed in the structure of FIG. 14. FIG. 23 is a cross-sectional view along line M-N of FIG. 22. FIG. 24 shows views illustrating emission states when a display panel having the structure of FIGS. 22 and 23 is driven before and after the display panel is repaired.

The structure of FIG. 22 can be the same as the structure of each of the first to fourth emission areas EA1, EA2, EA3, and EA4 and the non-emission area NEA1 described with reference to FIG. 14.

However, as shown in FIG. 22, the display panel according to embodiments of the present disclosure can further include a first repair pattern 2241 and a second repair pattern 2242 disposed between emission areas disposed in an $(N-1)^{th}$ row and an $N^{th}$ row.

Specifically, the first repair pattern 2241 and the second repair pattern 2242 can be disposed between a first emission area EA1 disposed in the $(N-1)^{th}$ row and a first emission area EA1 disposed in the $N^{th}$ row.

A portion of the first repair pattern 2241 overlapping a first color filter 211 can overlap a portion of a first electrode 220 corresponding to a second sub-emission area EA12 of a first emission area EA1 disposed in the $(N-1)^{th}$ row and an $M^{th}$ column. Another portion of the first repair pattern 2241 overlapping the first color filter 211 can overlap a portion of a first electrode 220 corresponding to a first sub-emission area EA11 of a first emission area EA1 disposed in the $N^{th}$ row and the $M^{th}$ column.

In addition, a portion of the second repair pattern 2242 overlapping the first color filter 211 can overlap a portion of a first electrode 220 corresponding to a fourth sub-emission area EA14 of the first emission area EA1 disposed in the $(N-1)^{th}$ row and the $M^{th}$ column. Another portion of the second repair pattern 2242 overlapping the first color filter 211 can overlap a portion of a first electrode 220 corresponding to a third sub-emission area EA13 of the first emission area EA1 disposed in the $N^{th}$ row and the $M^{th}$ column.

A portion of one first repair pattern 2241 positioned in a non-emission area NEA around a second emission area EA2 is can overlap a portion of a first electrode 220 corresponding to a second sub-emission area EA22 of a second emission area EA2 disposed in the $(N-1)^{th}$ row and the $M^{th}$ column. Another portion of the first repair pattern 2241 overlapping the first color filter 211 can overlap a portion of a first electrode 220 corresponding to a first sub-emission area EA21 of a second emission area EA2 disposed in the $N^{th}$ row and the $M^{th}$ column.

In addition, a portion of one second repair pattern 2242 positioned in the non-emission area NEA around the second emission area EA2 can overlap a portion of a first electrode 220 corresponding to a fourth sub-emission area EA24 of the second emission area EA2 disposed in the $(N-1)^{th}$ row and the $M^{th}$ column. Another portion of the second repair pattern 2242 can overlap a portion of a first electrode 220 corresponding to a third sub-emission area EA23 of the second emission area EA2 disposed in the $N^{th}$ row and the $M^{th}$ column.

A portion of the first repair pattern 2241 overlapping a second color filter 212 can overlap a portion of a first electrode 220 corresponding to a second sub-emission area EA32 of a third emission area EA3 disposed in the $(N-1)^{th}$ row and the $M^{th}$ column. Another portion of the first repair pattern 2241 overlapping the second color filter 212 can overlap a portion of a first electrode 220 corresponding to a first sub-emission area EA31 of a third emission area EA3 disposed in the $N^{th}$ row and the $M^{th}$ column.

In addition, a portion of the second repair pattern 2242 overlapping the second color filter 212 can overlap a portion of a first electrode 220 corresponding to a fourth sub-emission area EA34 of the third emission area EA3 disposed in the $(N-1)^{th}$ row and the $M^{th}$ column. Another portion of the second repair pattern 2242 overlapping the second color filter 212 can overlap a portion of a first electrode 220 corresponding to a third sub-emission area EA33 of the third emission area EA3 disposed in the $N^{th}$ row and the $M^{th}$ column.

A portion of the first repair pattern 2241 overlapping a third color filter 213 can overlap a portion of a first electrode 220 corresponding to a second sub-emission area EA42 of a fourth emission area EA4 disposed in the $(N-1)^{th}$ row and the $M^{th}$ column. Another portion of the first repair pattern 2241 overlapping the third color filter 213 can overlap a portion of a first electrode 220 corresponding to a first sub-emission area EA41 of a fourth emission area EA4 disposed in the $N^{th}$ row and the $M^{th}$ column.

In addition, a portion of the second repair pattern 2242 overlapping the third color filter 213 can overlap a portion of a first electrode 220 corresponding to a fourth sub-emission area EA44 of the fourth emission area EA4 disposed in the $(N-1)^{th}$ row and the $M^{th}$ column. Another portion of the second repair pattern 2242 overlapping the third color filter 213 can overlap a portion of a first electrode 220 corresponding to a third sub-emission area EA43 of the fourth emission area EA4 disposed in the $N^{th}$ row and the $M^{th}$ column.

As shown in FIG. 23, the first and second repair patterns 2241 and 2242 can be disposed below an overcoat layer 302. The first electrode 220 disposed to correspond to each sub-emission area can be disposed on the overcoat layer 302.

Meanwhile, in the structure of the display panel shown in FIG. 22, when a foreign material is present on one connection pattern 230, a sub-emission area connected to the connection pattern 230 can be normally operated through cutting of the connection pattern 230 and repairing using the first and second repair patterns 2241 and 2242.

For example, when a foreign material is present on a first connection pattern 1431, which is connected to the first sub-emission area EA31 of the third emission area EA3, in the connection pattern 230 positioned in the $N^{th}$ row and the $M^{th}$ column, a bright spot defect can occur in the first sub-emission area EA31 of the third emission area EA3. In order to prevent the bright spot defect, the first connection pattern 1431 can be disconnected from a circuit area using a laser (Step 1).

In this case, as shown in FIG. 24, even when a signal is applied to the $N^{th}$ row, the first sub-emission area EA31 of the third emission area EA3 positioned in the $N^{th}$ row and the $M^{th}$ column does not emit light.

Thereafter, in order to repair the first sub-emission area EA31 of the third emission area EA3, as shown in FIGS. 22 and 23, a laser can be irradiated onto the first repair pattern 2241 overlapping each of the first electrode 220 disposed to correspond to the second sub-emission area EA32 of the third emission area EA3 positioned in the $(N-1)^{th}$ row and the $M^{th}$ column and the first electrode 220 disposed to correspond to the first sub-emission area EA31 of the third emission area EA3 positioned in the $N^{th}$ row and the $M^{th}$ column.

After the laser is irradiated, the first repair pattern 2241 shown in FIG. 23 can be connected to the first electrodes 220 disposed on the first repair pattern 2241.

Since the first electrode 220 disposed to correspond to the first sub-emission area EA31 of the third emission area EA3 positioned in the $(N-1)^{th}$ row and the $M^{th}$ column and the first electrode 220 disposed to correspond to the first sub-emission area EA31 of the third emission area EA3 positioned in the $N^{th}$ row and the $M^{th}$ column are in a state of being in contact with a repair pattern 1940, the first and third sub-emission areas EA31 and EA33 of the third emission area EA3 positioned in the $N^{th}$ row and the $M^{th}$ column can be electrically connected to a circuit area for driving the third emission area EA3 positioned in the $(N-1)^{th}$ row and the $M^{th}$ column.

Accordingly, as shown in FIG. 24, after repairing is performed (after Step 2), when the third emission area EA3 disposed in the $(N-1)^{th}$ row and the $M^{th}$ column is driven, the first sub-emission area EA31 of the third emission area EA3 disposed in the $N^{th}$ row and the $M^{th}$ column can also be driven.

For example, even when a foreign material is generated on the connection pattern 230, since one emission area is divided into at least four sub-emission areas and an area of each sub-emission area is smaller than an area of one emission area, even when a sub-emission area disposed in a corresponding row is repaired to emit light when another adjacent row is in an on state, it is possible to reduce a possibility of a decrease in visibility.

Meanwhile, although, in the above-described embodiments, a structure has been mainly described in which a display panel according to embodiments of the present disclosure includes first to fourth emission areas EA1, EA2, EA3, and EA4 which emit light having different colors, the present disclosure is not limited thereto, and the same can also be applied to a structure in which a display panel includes at least two emission areas which emit light having different colors.

The above-described embodiments of the present disclosure will be briefly described below.

There can be provided an organic light-emitting display device including at least two emission areas EA1, EA2, EA3, and EA4 and a non-emission area NEA configured to surround the emission areas, wherein at least one emission area EA1, EA2, EA3, or EA4 includes a first sub-emission area disposed in a first sub-row and a second sub-emission area disposed in a second sub-row adjacent to the first sub-row, the organic light-emitting display device includes one circuit area disposed between the first sub-row and the second sub-row and configured to drive the first and second sub-emission areas, a plurality of first electrodes 220 are disposed in each of the first and second sub-emission areas, the organic light-emitting display device includes a connection pattern 230 electrically connected to the first electrode 220 and including a first connection pattern 231 or 1431 and a second connection pattern 232 or 1432 electrically connected to and formed integrally with the circuit area, the first electrode disposed in the first sub-emission area is connected to the first connection pattern, the first electrode disposed in the second sub-emission area is connected to the second connection pattern, a repair pattern 240 or 1940 is disposed between the first sub-emission area of one emission area and the second sub-emission area of the emission area disposed in another adjacent row, and the repair pattern 240 or 1940 is spaced apart from the connection pattern 230.

The first sub-emission area and the second sub-emission area driven through the one circuit area can emit the same color light.

The plurality of emission areas can be disposed in a plurality of rows N−1 and N and a plurality of columns M, the emission areas configured to emit light having different colors can be alternately disposed in the plurality of rows, and the emission areas configured to emit the same color light can be disposed in one column.

The first electrode 220 disposed in the first sub-emission area of the at least one emission area disposed in one row and the first electrode 220 disposed in the second sub-emission area of the emission area disposed in another row adjacent to the one row can overlap one repair pattern 240 or 1940.

The one repair pattern 240 or 1940 can be disposed between two connection patterns 230.

The organic light-emitting display device can include a transistor 405 disposed on a substrate 300, an insulating layer 301 disposed on the transistor, a plurality of repair patterns 240 disposed on the insulating layer, an overcoat layer 302 disposed on the repair patterns, and the first electrode 220 and the connection pattern 230 disposed on the overcoat layer 302, and two first electrodes 220 can be connected to one connection pattern 230.

The connection pattern 230 can be electrically connected to the transistor 405 through a contact hole CNT formed in the overcoat layer 302 and the insulating layer 301.

The overcoat layer 302 can include a first hole 401 spaced apart from the contact hole CNT and a second hole 402 spaced apart from the first hole 401 and the contact hole CNT, and the connection pattern 230 can be disposed in the first hole 401 and the second hole 402.

The first hole 401 can be formed in the non-emission area NEA around the first sub-emission area of the at least one emission area disposed in one row, and the second hole 402 can be formed in the non-emission area around the second sub-emission area of the emission area disposed in another row adjacent to the one row.

The first connection pattern 231 disposed in the first hole 401 can be electrically connected to the first electrode 220 disposed in a first sub-emission area EA11, EA21, EA31, or EA41, and the second connection pattern 232 disposed in the second hole 402 can be electrically connected to the first electrode 220 disposed in a second sub-emission area EA12, EA22, EA32, or EA42.

When a foreign material is disposed on at least one connection pattern 231 of first connection patterns 231, the first connection pattern 231 on which the foreign material is disposed can be electrically disconnected from the circuit area, and the first connection pattern 231 electrically connected to the first connection pattern 231 on which the foreign material is disposed can be electrically connected to the circuit area in another adjacent row through a connection of the first electrode 220 positioned in another adjacent row and the repair pattern 240.

The at least one emission area can further include a third sub-emission area EA13, EA23, EA33, or EA43 spaced apart from a first sub-emission area EA11, EA21, EA31, or EA41 and disposed in the first sub-row, and a fourth sub-emission area EA14, EA24, EA34, or EA44 spaced apart from a second sub-emission area EA12, EA22, EA32, or EA42 and disposed in the second sub-row, and the first to fourth sub-emission areas can emit the same color light.

The connection pattern 230 can further include a third connection pattern 1433 and a fourth connection pattern 1434, the first electrode 220 disposed in the third sub-emission area EA13, EA23, EA33, or EA43 can be electrically connected to the third connection pattern 1431, and the first electrode disposed 220 in the fourth sub-emission area EA14, EA24, EA34, or EA44 can be connected to the fourth connection pattern 1434.

The first to fourth connection patterns 1431, 1432, 1433, and 1434 can be areas into which an area in which a contact hole CNT of the overcoat layer 302 disposed below the connection pattern 230 is formed branches off.

The connection pattern 230 can further include one or more reflective patterns 1450, and the reflective pattern 1450 can be disposed between the first sub-emission area and the third sub-emission area and disposed between the second sub-emission area and the fourth sub-emission area.

The reflective pattern between the first sub-emission area and the third sub-emission area of the at least one emission area disposed in one row and the reflective pattern between the second sub-emission area and the fourth sub-emission area of the emission area disposed in another row adjacent to the one row can each overlap one repair pattern 1940.

The organic light-emitting display device can include an insulating layer 301 disposed on a substrate 300, the plurality of reflective patterns 1450 disposed on the insulating layer and spaced apart from each other, an overcoat layer 302 disposed on the reflective patterns 1450, and the repair pattern 1940 disposed on the overcoat layer and overlapping a portion of each of at least two reflective patterns 1450.

When a foreign material is disposed at least one first connection pattern 1431 of a plurality of first connection patterns 1431, the first connection pattern 1431 on which the foreign material is disposed can be electrically disconnected from the circuit area, and the first electrode 220 electrically connected to the first connection pattern 1431 on which the foreign material is disposed can be electrically connected to the circuit area in another adjacent row through a connection of the reflective pattern 1450 positioned in another adjacent row and the repair pattern 1940.

A first repair pattern 2241 can be disposed between the first sub-emission area of the at least one emission area disposed in one row and the second sub-emission area of the emission area disposed in another adjacent row, and a second repair pattern 2242 can be disposed between the third sub-emission area disposed at one side of the first sub-emission area and the fourth sub-emission area disposed at one side of the second sub-emission area.

When a foreign material is disposed on at least one first connection pattern 1431 of a plurality of first connection patterns 1431, the first connection pattern 1431 on which the foreign material is disposed can be electrically disconnected from the circuit area, and the first electrode 220 electrically connected to the first connection pattern 1431 on which the foreign material is disposed can be electrically connected to the circuit area in another adjacent row through a connection of the first electrode 220 positioned in another adjacent row and the repair pattern 1940.

The organic light-emitting display device can include a bank 250 disposed in the non-emission area NEA, an organic light-emitting layer 360 disposed on the bank 250 and the first electrode 220, and a second electrode 370 disposed on the organic light-emitting layer 360, and each of the connection pattern 230 and the repair pattern 240 or 1940 can overlap the bank 250.

Embodiments of the present disclosure can provide an organic light-emitting display panel in which, even when a foreign material is present in an active area, a bright spot defect is not generated due to a connection pattern and a repair pattern, and an organic light-emitting display device including the same.

Embodiments of the present can provide an organic light-emitting display panel which has a structure capable of preventing a decrease in visibility by reducing an area for emitting light in an emission area connected to a circuit area of an emission area disposed in an adjacent row, and an organic light-emitting display device including the same.

Embodiments of the present disclosure can provide an organic light-emitting display panel having an improved light extraction effect by reducing an amount of light trapped in an organic light-emitting display panel through a connection pattern disposed in a non-emission area and increasing an amount of light extracted out of a substrate, and an organic light-emitting display device including the same.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the present invention. The above description and the accompanying drawings provide an example of the technical idea of the present invention for illustrative purposes only. For example, the disclosed embodiments are intended to illustrate the scope of the technical idea of the present invention.

Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:

1. An organic light-emitting display device comprising:
    a plurality of emission areas, wherein at least one emission area among the plurality of emission areas comprises a first sub-emission area disposed in a first sub-row and a second sub-emission area disposed in a second sub-row adjacent to the first sub-row, and a plurality of first electrodes are disposed in each of the first and second sub-emission areas;
    a non-emission area configured to surround the emission areas;
    a circuit area disposed between the first sub-row and the second sub-row and configured to drive the first and second sub-emission areas; and
    a connection pattern electrically connected to the first electrode and comprising a first connection pattern and a second connection pattern electrically connected to and formed integrally with the circuit area,
    wherein;
    the first electrode disposed in the first sub-emission area is connected to the first connection pattern;
    the first electrode disposed in the second sub-emission area is connected to the second connection pattern;
    a repair pattern is disposed between the first sub-emission area of one emission area and the second sub-emission area of the emission area disposed in another adjacent row; and
    the repair pattern is spaced apart from the connection pattern.

2. The organic light-emitting display device of claim 1, wherein the first sub-emission area and the second sub-emission area driven through the one circuit area emit a same color light.

3. The organic light-emitting display device of claim 1, wherein:
    the plurality of emission areas are disposed in a plurality of rows and a plurality of columns;
    the emission areas configured to emit light having different colors are alternately disposed in the plurality of rows; and
    the emission areas configured to emit the same color light are disposed in one column.

4. The organic light-emitting display device of claim 3, wherein the first electrode disposed in the first sub-emission area of the at least one emission area disposed in one row and the first electrode disposed in the second sub-emission area of the emission area disposed in another row adjacent to the one row overlap one repair pattern.

5. The organic light-emitting display device of claim 4, wherein the one repair pattern is disposed between the first and second connection patterns.

6. The organic light-emitting display device of claim 1, comprising:
    a transistor disposed on a substrate;
    an insulating layer disposed on the transistor;
    a plurality of repair patterns, each of which is identical to the repair pattern, disposed on the insulating layer;
    an overcoat layer disposed on the repair patterns; and
    the first electrode and the connection pattern disposed on the overcoat layer,
    wherein two first electrodes are connected to one connection pattern.

7. The organic light-emitting display device of claim 6, wherein the connection pattern is electrically connected to the transistor through a contact hole formed in the overcoat layer and the insulating layer.

8. The organic light-emitting display device of claim 7, wherein:
the overcoat layer comprises a first hole spaced apart from the contact hole and a second hole spaced apart from the first hole and the contact hole; and
the connection pattern is disposed in the first hole and the second hole.

9. The organic light-emitting display device of claim 8, wherein:
the first hole is formed in the non-emission area around the first sub-emission area of the at least one emission area disposed in one row; and
the second hole is formed in the non-emission area around the second sub-emission area of the emission area disposed in another row adjacent to the one row.

10. The organic light-emitting display device of claim 9, wherein:
the first connection pattern disposed in the first hole is electrically connected to the first electrode disposed in the first sub-emission area; and
the second connection pattern disposed in the second hole is electrically connected to the first electrode disposed in the second sub-emission area.

11. The organic light-emitting display device of claim 6, wherein, when a foreign material is disposed on at least one first connection pattern of a plurality of first connection patterns each identical to the first connection pattern,
the first connection pattern on which the foreign material is disposed is electrically disconnected from the circuit area, and
the first electrode electrically connected to the first connection pattern on which the foreign material is disposed is electrically connected to the circuit area in another adjacent row through a connection of the first electrode positioned in another adjacent row and the repair pattern.

12. The organic light-emitting display device of claim 1, wherein:
the at least one emission area further comprises a third sub-emission area spaced apart from the first sub-emission area and disposed in the first sub-row, and a fourth sub-emission area spaced apart from the second sub-emission area and disposed in the second sub-row; and
the first to fourth sub-emission areas emit a same color light.

13. The organic light-emitting display device of claim 12, wherein:
the connection pattern further comprises a third connection pattern and a fourth connection pattern;
the first electrode disposed in the third sub-emission area is electrically connected to the third connection pattern; and
the first electrode disposed in the fourth sub-emission area is connected to the fourth connection pattern.

14. The organic light-emitting display device of claim 13, wherein the first to fourth connection patterns are areas into which an area in which a contact hole of the overcoat layer disposed below the connection pattern is formed branches off.

15. The organic light-emitting display device of claim 12, wherein:
the connection pattern further comprises one or more reflective patterns; and
the reflective pattern is disposed between the first sub-emission area and the third sub-emission area and disposed between the second sub-emission area and the fourth sub-emission area.

16. The organic light-emitting display device of claim 15, wherein the reflective pattern between the first sub-emission area and the third sub-emission area of the at least one emission area disposed in one row and the reflective pattern between the second sub-emission area and the fourth sub-emission area of the emission area disposed in another row adjacent to the one row each overlap one repair pattern.

17. The organic light-emitting display device of claim 16, comprising:
an insulating layer disposed on a substrate;
the plurality of reflective patterns disposed on the insulating layer and spaced apart from each other;
an overcoat layer disposed on the reflective patterns; and
the repair pattern disposed on the overcoat layer and overlapping a portion of each of at least two reflective patterns among the plurality of reflective patterns.

18. The organic light-emitting display device of claim 17, wherein, when a foreign material is disposed on at least one first connection pattern of a plurality of first connection patterns identical to the first connection pattern,
the first connection pattern on which the foreign material is disposed is electrically disconnected from the circuit area, and
the first electrode electrically connected to the first connection pattern on which the foreign material is disposed is electrically connected to the circuit area in another adjacent row through a connection of the reflective pattern positioned in another adjacent row and the repair pattern.

19. The organic light-emitting display device of claim 15, wherein:
a first repair pattern is disposed between the first sub-emission area of the at least one emission area disposed in one row and the second sub-emission area of the emission area disposed in another adjacent row; and
a second repair pattern is disposed between the third sub-emission area disposed at one side of the first sub-emission area and the fourth sub-emission area disposed at one side of the second sub-emission area.

20. The organic light-emitting display device of claim 19, comprising:
an insulating layer disposed on a substrate;
the first and second repair patterns disposed on the insulating layer and spaced apart from each other;
an overcoat layer disposed on the first and second repair patterns; and
the plurality of first electrodes disposed on the overcoat layer,
wherein each of two first electrodes overlaps a portion of the first repair pattern or the second repair pattern.

21. The organic light-emitting display device of claim 20, wherein, when a foreign material is disposed on at least one first connection pattern of a plurality of first connection patterns identical to the first connection pattern,
the first connection pattern on which the foreign material is disposed is electrically disconnected from the circuit area, and
the first electrode electrically connected to the first connection pattern on which the foreign material is disposed is electrically connected to the circuit area in another adjacent row through a connection of the first electrode positioned in another adjacent row and the repair pattern.

22. The organic light-emitting display device of claim 1, comprising:
- a bank disposed in the non-emission area;
- an organic light-emitting layer disposed on the bank and the first electrode; and
- a second electrode disposed on the organic light-emitting layer,
- wherein each of the connection pattern and the repair pattern overlaps the bank.

23. An organic light-emitting display panel comprising:
- a plurality of emission areas comprising a first electrode, an organic light-emitting layer, and a second electrode, wherein at least one emission area among the plurality of emission areas comprises a first sub-emission area disposed in a first sub-row and a second sub-emission area disposed in a second sub-row adjacent to the first sub-row, and a plurality of first electrodes identical to the first electrode are disposed in each of the first and second sub-emission areas;
- a non-emission area configured to surround the emission areas;
- a circuit area disposed between the first sub-row and the second sub-row and configured to drive the first and second sub-emission areas; and
- a connection pattern electrically connected to the first electrode and comprising a first connection pattern and a second connection pattern electrically connected to and formed integrally with the circuit area, wherein:
- the first electrode disposed in the first sub-emission area is connected to the first connection pattern;
- the first electrode disposed in the second sub-emission area is connected to the second connection pattern; and
- a repair pattern is disposed between the first sub-emission area of one emission area and the second sub-emission area of the emission area disposed in another adjacent row.

* * * * *